(12) United States Patent
Oh et al.

(10) Patent No.: US 11,335,668 B2
(45) Date of Patent: May 17, 2022

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Eunkyul Oh, Gwacheon-si (KR); Yunrae Cho, Guri-si (KR); Taeheon Kim, Asan-si (KR); Seunghun Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 157 days.

(21) Appl. No.: 16/896,897

(22) Filed: Jun. 9, 2020

(65) Prior Publication Data

US 2021/0134761 A1 May 6, 2021

(30) Foreign Application Priority Data

Oct. 30, 2019 (KR) .................. 10-2019-0136942

(51) Int. Cl.
*H01L 23/48* (2006.01)
*H01L 21/78* (2006.01)
(Continued)

(52) U.S. Cl.
CPC ........ *H01L 25/0657* (2013.01); *H01L 21/565* (2013.01); *H01L 21/76898* (2013.01);
(Continued)

(58) Field of Classification Search
CPC ............... H01L 25/0657; H01L 21/565; H01L 21/76898; H01L 21/78; H01L 22/12; H01L 22/32; H01L 23/481; H01L 24/14; H01L 25/18; H01L 25/50; H01L 2224/14517; H01L 2225/06513; H01L 2225/06541; H01L 2225/06586; H01L 2225/06596;
(Continued)

(56) References Cited

U.S. PATENT DOCUMENTS

| 6,677,677 B2 | 1/2004 | Kimura et al. |
| 7,750,469 B2 | 7/2010 | Cho et al. |

(Continued)

FOREIGN PATENT DOCUMENTS

| JP | 4067502 | 3/2008 |
| JP | 2008-218758 | 9/2008 |

(Continued)

*Primary Examiner* — Elias Ullah
(74) *Attorney, Agent, or Firm* — F. Chau & Associates, LLC

(57) ABSTRACT

The present disclosure relates to a semiconductor package and a manufacturing method thereof. The method includes stacking semiconductor chips using a thermo-compression bonding (TCB) method, where defects are minimized for increased reliability. The semiconductor package includes an interface chip including a first test pad, a bump pad provided inside the first test pad, and a first through silicon via (TSV) provided between the first test pad and the bump pad; at least one memory chip, which is stacked on the interface chip and includes a second test pad, a dummy pad provided inside the second test pad, and a second TSV provided between the second test pad and the dummy pad; and an adhesive layer provided between the interface chip and the at least one memory chip. wherein no bump is provided on the first test pad and the second test pad.

20 Claims, 23 Drawing Sheets

(51) Int. Cl.
    *H01L 25/065*     (2006.01)
    *H01L 23/00*     (2006.01)
    *H01L 21/66*     (2006.01)
    *H01L 21/56*     (2006.01)
    *H01L 21/768*     (2006.01)
    *H01L 25/00*     (2006.01)
    *H01L 25/18*     (2006.01)

(52) U.S. Cl.
    CPC .............. *H01L 21/78* (2013.01); *H01L 22/12* (2013.01); *H01L 22/32* (2013.01); *H01L 23/481* (2013.01); *H01L 24/14* (2013.01); *H01L 25/18* (2013.01); *H01L 25/50* (2013.01); *H01L 2224/14517* (2013.01); *H01L 2225/06513* (2013.01); *H01L 2225/06541* (2013.01); *H01L 2225/06586* (2013.01); *H01L 2225/06596* (2013.01)

(58) Field of Classification Search
    CPC ... H01L 24/12; H01L 21/563; H01L 23/3128; H01L 2225/06565; H01L 23/49816; H01L 24/06; H01L 24/16
    See application file for complete search history.

(56)     References Cited

U.S. PATENT DOCUMENTS

| | | |
|---|---|---|
| 8,884,445 B2 | 11/2014 | Lee |
| 9,214,438 B2 | 12/2015 | Lee et al. |
| 10,175,294 B2 | 1/2019 | Wu et al. |
| 2012/0080789 A1 | 4/2012 | Shiota et al. |
| 2015/0144390 A1 | 5/2015 | Nejime |
| 2016/0351541 A1 | 12/2016 | Fukayama et al. |
| 2017/0179062 A1 | 6/2017 | Jang et al. |

FOREIGN PATENT DOCUMENTS

| | | |
|---|---|---|
| JP | 5539346 | 7/2014 |
| KR | 10-1134168 | 3/2012 |
| KR | 10-2017-0074294 | 6/2017 |

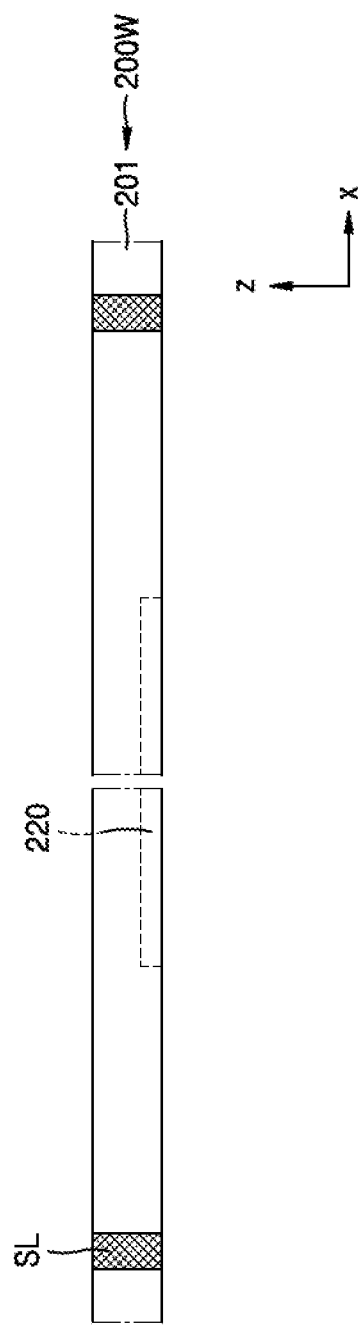

SEMICONDUCTOR PACKAGE AND METHOD OF FABRICATING THE SAME

CROSS-REFERENCE TO RELATED APPLICATIONS

This application claims the benefit of Korean Patent Application No. 10-2019-0136942, filed on Oct. 30, 2019, in the Korean Intellectual Property Office, the disclosure of which is incorporated by reference herein in its entirety.

BACKGROUND

The inventive concept relates to a semiconductor package, and more particularly, to a semiconductor package including a through silicon via (TSV).

Semiconductor devices are electrical components that leverage a semiconductor material to control electrical properties. Multiple semiconductor devices stacked together create an integrated circuit, or chip. Chips are used to store and process information. Televisions, computers, and mobile phones use chips as an integral part of their function.

In certain chip manufacturing processes, bumps of solder are manufactured on chips to connect and create space between stacked chips. Solder is injected between the chips to form the connection between the chips. However, the bumps can be deformed during manufacturing, leading to possible defects, such as a short circuit of the semiconductor device. A short circuit can render a semiconductor device useless. Therefore, there is a need in the art for systems and methods to reduce the likelihood of defects when stacking chips on one-another.

SUMMARY

The present disclosure describes a semiconductor package in which semiconductor chips are stacked by using a thermo-compression bonding (TCB) method and defects like a short circuit between adjacent bumps are minimized for improved reliability and a method of fabricating the same.

According to an aspect of the inventive concept, there is provided a semiconductor package including an interface chip comprising a first test pad provided in an outer portion of the interface chip, a bump pad provided inside the first test pad, and a first through silicon via (TSV) provided between the first test pad and the bump pad; at least one memory chip stacked on the interface chip, wherein the at least one memory chip comprises a second test pad provided in an outer portion of the at least one memory chip, a dummy pad provided inside the second test pad, and a second TSV provided between the second test pad and the dummy pad; and an adhesive layer provided between the interface chip and the at least one memory chip, wherein a first bump is provided on the bump pad on a bottom surface of the interface chip, a second bump is provided on the second TSV on a bottom surface of the at least one memory chip, a dummy bump is provided on the bottom surface of the at least one memory chip to be adjacent to the second bump, and no bump is provided on the first test pad and the second test pad.

According to another aspect of the inventive concept, there is provided a semiconductor package including an interface chip including a first test pad provided in an outer portion, a bump pad provided inside the first test pad, and a first through silicon via (TSV) provided between the first test pad and the bump pad; at least one memory chip, which is stacked on the interface chip and includes a second test pad provided in an outer portion, a dummy pad provided inside the second test pad, and a second TSV provided between the second test pad and the dummy pad; and an adhesive layer provided between the interface chip and the memory chip, wherein the interface chip and the memory chip have substantially the same size, the first test pad and the second test pad overlap each other, and the bump pad and the dummy pad overlap each other, and the bump pad is formed in an open structure, and the dummy pad is formed in a closed structure.

According to another aspect of the inventive concept, there is provided a semiconductor package including a printed circuit substrate (PCB); an interface chip, which is stacked on the PCB and includes a first test pad provided in an outer portion, a bump pad provided inside the first test pad, and a first TSV provided between the first test pad and the bump pad; at least one memory chip, which is stacked on the interface chip and includes a second test pad provided in an outer portion, a dummy pad provided inside the second test pad, and a second TSV provided between the second test pad and the dummy pad; an adhesive layer provided between the interface chip and the memory chip; and a sealant for sealing the interface chip and the memory chip on the PCB, wherein the interface chip and the memory chip have substantially the same size, the bump pad and the dummy pad overlap each other and the first test pad and the second test pad overlap each other, a first bump is provided on the bump pad on the bottom surface of the interface chip, and a second bump provided on the second TSV on the bottom surface of the memory chip and a first dummy bump provided on the dummy pad on the bottom surface of the memory chip.

According to another aspect of the inventive concept, there is provided a method of fabricating a semiconductor package, the method including preparing an interface chip; preparing a memory chip; stacking the interface chip on a printed circuit board (PCB); and stacking the memory chip on the interface chip via a non-conductive film (NCF) by using a temperature-compression bonding (TCB) method, wherein an interface chip includes a first test pad provided in an outer portion, a bump pad provided inside the first test pad, and a first TSV provided between the first test pad and the bump pad, the memory chip includes a second test pad provided in an outer portion, a dummy pad provided inside the second test pad, and a second TSV provided between the second test pad and the dummy pad, the interface chip and the memory chip have substantially the same size, the bump pad and the dummy pad overlap each other and the first test pad and the second test pad overlap each other, and a first bump is provided on the bump pad, a second bump is provided on the second TSV, and a first dummy bump is provided on the dummy pad.

According to another aspect of the inventive concept, a semiconductor device comprises a first chip; a second chip; one or more bumps between the first chip and the second chip, wherein each of the one or more bumps electronically connect the first chip and the second chip for transmitting data; and one or more dummy bumps between the first chip and the second chip, wherein the one or more dummy bumps are configured to reduce a flow rate of a non-conductive film (NCF) during a temperature-compression bonding (TCB) process, and wherein the one or more dummy bumps do not electronically connect the first chip and the second chip.

BRIEF DESCRIPTION OF THE DRAWINGS

Embodiments of the inventive concept will be more clearly understood from the following detailed description taken in conjunction with the accompanying drawings in which:

FIGS. 10A through 10E are cross-sectional views showing an operation for preparing the interface chip of FIG. 9A in more detail.

DETAILED DESCRIPTION OF THE EMBODIMENTS

In conventional chip stacking processes, a mass of solder called a bump, is applied to chip pads of a chip. These bumps connect and create space between stacked chips. The stacking process is known as 3D chip stacking. In a 3D chip stack package using a through silicon via (TSV), stacking may be performed by using temperature-compression bonding (TCB). During TCB, the shape of a bump joint may be deformed by the flow of a non-conductive film (NCF). As a result, a defect like a short circuit between adjacent bumps may occur.

Therefore, in a semiconductor package according to embodiments of the present disclosure, dummy bumps are placed between the bumps of a memory chip. As a result, the flowability of the NCF may be minimized when a memory chip is stacked on an interface chip, thereby preventing problems including a short circuit between bumps. Additionally, poor contact between a bump and a pad due to solder sweeping may be addressed. As a result, the reliability of the semiconductor package may be increased.

Figure 1A:
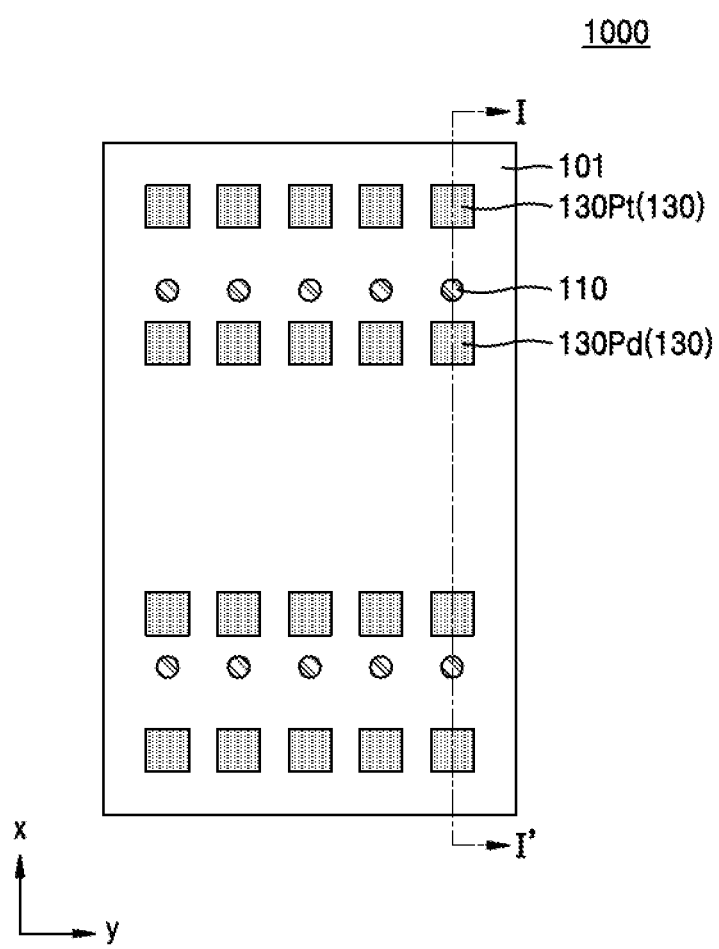
FIGS. 1A and 1B are a plan view and a cross-sectional view of a semiconductor package according to an embodiment of the inventive concept.
Figure 1B:
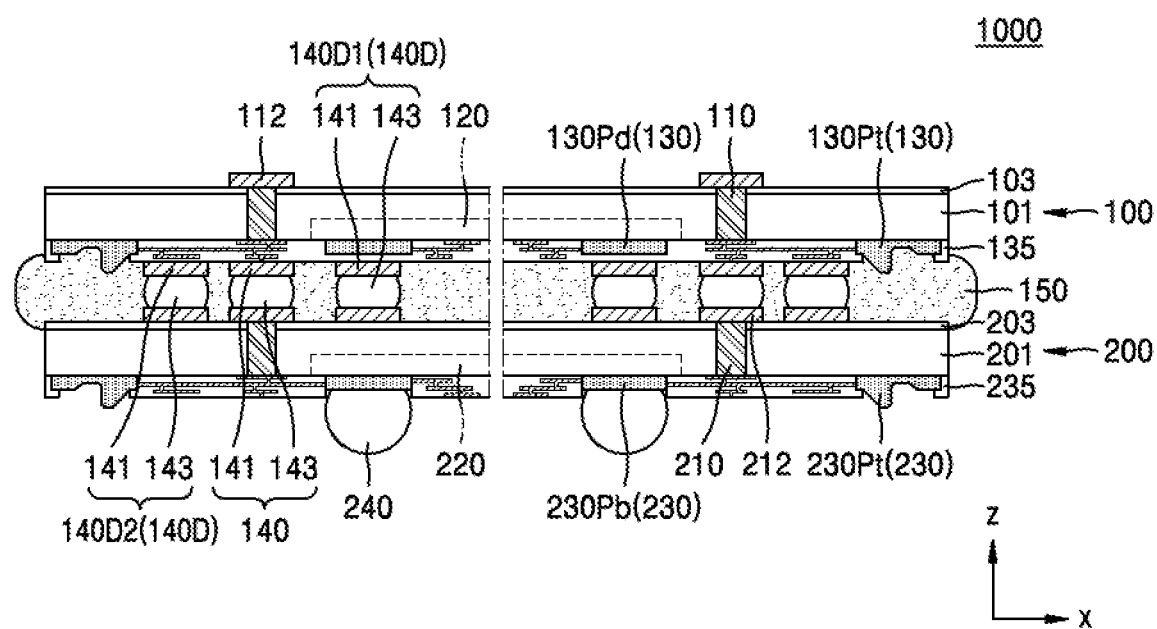

FIGS. 1A and 1B are a plan view and a cross-sectional view of a semiconductor package according to an embodiment of the inventive concept. FIG. 1A is a plan view of a bottom surface of a memory chip in a semiconductor package, wherein, for convenience of explanation, a substrate, a second through silicon via (TSV), and a second pad are shown. FIG. 1B is a cross-sectional view of the semiconductor package corresponding to the cutting of a portion I-I' of FIG. 1A.

Referring to FIGS. 1A and 1B, a semiconductor package 1000 of the present embodiment may include a memory chip 100, an interface chip 200, and an adhesive layer 150.

The interface chip 200 may include a substrate 201, a first TSV 210, a device layer 220, a first pad 230, and a first bump 240. The interface chip 200 may have substantially the same size as the memory chip 100 provided thereon. However, the size of the interface chip 200 is not limited thereto. For example, in some embodiments, the interface chip 200 may have a larger size than the memory chip 100.

The substrate 201 may include, for example, a semiconductor element like silicon (Si) or germanium (Ge). Additionally, the substrate 201 may include a compound semiconductor like silicon carbide (SiC), gallium arsenide (GaAs), indium arsenide (InAs), or indium phosphide (InP). The substrate 201 may have a silicon-on-insulator (SOI) structure. For example, the substrate 201 may include a buried oxide (BOX) layer. The substrate 201 may include a conductive region, for example, a well doped with impurities or a structure doped with impurities. The substrate 201 may include various device isolation structures, e.g., a shallow trench isolation (STI) structure.

The first TSV 210 may be formed to penetrate through the substrate 201 entirely or partially. Additionally, the first TSV 210 may extend into the device layer 220. The first TSV 210 has a pillar-like shape and may include a barrier film on an outer surface and a buried conductive layer therein. The barrier film may include at least one material selected from among Ti, TiN, Ta, TaN, Ru, Co, Mn, WN, Ni, and NiB. The buried conductive layer may include at least one material selected from among Cu alloys like Cu, CuSn, CuMg, CuNi, CuZn, CuPd, CuAu, CuRe, and CuW, W, W alloys, Ni, Ru, and Co. Moreover, a via insulation layer may be between the first TSV 210 and the substrate 201 or between the first TSV 210 and the device layer 220. The via insulation layer may include, for example, an oxide film, a nitride film, a carbide film, a polymer, or a combination thereof An upper pad 212 may be provided on the top surface of the first TSV 210. A protective insulation layer 203 may be formed on the top surface of the substrate 201, the first TSV 210 may extend through the protective insulation layer 203, and the upper pad 212 may be provided on the first TSV 210 and the protective insulation layer 203. The upper pad 212 may include, for example, at least one from among aluminum (Al), copper (Cu), nickel (Ni), tungsten (W), platinum (Pt), and gold (Au).

The device layer 220 may include various types of devices. For example, the device layer 220 may include field-effect transistors (FET) like a planar FET or a FinFET, memory devices like a flash memory, dynamic random access memory (DRAM), static random access memory (SRAM), electrically erasable programmable read-out (EEPROM), phase-change random access memory (PRAM), magnetoresistive random access memory (MRAM), ferroelectric random access memory (FeRAM), and resistive random access memory (RRAM), logic devices like AND, OR, and NOT, and various active devices and/or passive devices like a system large scale integration (LSI), a CMOS Imaging Sensor (CIS), and a Micro-Electro-Mechanical Systems (MEMS).

In the semiconductor package 1000 of the present embodiment, the interface chip 200 may include a plurality of logic devices and a plurality of memory devices in the device layer 220. The interface chip 200 may be provided under the memory chip 100 may transmit signals from the memory chip 100 to the outside. Additionally, the interface chip 200 may transmit signals and power from the outside to the memory chip 100. Moreover, the interface chip 200 may perform both a logic function and a memory function since the interface chip 200 includes memory devices in the device layer 220. In some embodiments, the interface chip 200 may include logic devices. The interface chip 200 may be referred to as a buffer chip or a control chip according to its functions. Alternatively, the memory chip 100 may include a plurality of memory devices in the device layer 120 and may be referred to as a core chip.

A wire layer 235 may be provided on the bottom surface of the substrate 201. The wire layer 235 may include a plurality of wire structures. For example, the wire structure may connect devices of the device layer 220 to one another, connect the devices to a conductive region of the substrate 201, or electrically connect the devices and the first TSV 210 to the first bump 240 via the first pad 230. The wire structure may include, for example, wires and/or vertical contacts.

The first pad 230 may be provided on the bottom surface of the substrate 201. Additionally, the first pad 230 may be provided to be electrically connected to the first TSV 210 and/or the device layer 220. The first pad 230 may have a flat rectangular plate-like shape. However, the shape of the first pad 230 is not limited thereto. For example, the first pad 230 may have a circular or elliptical flat plate-like shape or a polygonal flat plate-like shape other than a rectangular flat plate-like shape. The material constituting the first pad 230 is as described above with respect to the upper pad 212.

The first pad 230 may include a bump pad 230P$b$ provided inside the interface chip 200 and a first test pad 230P$t$ provided at an outer portion of the interface chip 200. As shown in FIG. 1B, the bump pad 230P$b$ may be a pad on which the first bump 240 is provided, and the first test pad 230P$t$ may be a pad for an electrical test of the interface chip 200.

In the semiconductor package 1000 of the present embodiment, no bump may be provided on the first test pad 230P$t$ of the interface chip 200. Note that, in some semiconductor package structures, a test pad of an interface chip may also function as a bump pad. Therefore, in a general semiconductor package structure, a test pad may be provided inside the interface chip, and a bump may be provided on the test pad. However, in the semiconductor package 1000 of the present embodiment, the first test pad 230P$t$ and the bump pad 230P$b$ may be positionally and functionally separated from each other. Additionally, the first bump 240 may be provided on the bump pad 230P$b$. Positions for arranging the bump pad 230P$b$ and the first test pad 230P$t$ is described below in more detail with reference to FIGS. 6A through 6C.

The first bump 240 is provided on the bump pad 230P$b$ of the bottom surface of the interface chip 200 and may be electrically connected to the devices of the device layer 220 and/or the first TSV 210 through the wire structures of the wire layer 235. Moreover, in FIG. 1B, the first bump 240 is simply shown as a ball-type solder layer, but the structure of the first bump 240 is not limited thereto. For example, the first bump 240 may have a structure including a pillar and a solder layer, similar to a second bump 140.

The structure of a bump including a pillar and a solder layer is described in more detail. The pillar may have a cylindrical shape or a polygonal pillar-like shape like a square pillar or an octagonal pillar and may include, for example, nickel (Ni), copper (Cu), palladium (Pd), Platinum (Pt), gold (Au), or a combination thereof. The solder layer is provided on the pillar and may have a spherical shape or a ball-like shape. The solder layer may include, for example, tin (Sn), indium (In), bismuth (Bi), antimony (Sb), copper (Cu), silver (Ag), zinc (Zn), lead (Pb), and/or an alloy thereof. For example, the solder layer may include Sn, Pb, Sn-Pb, Sn-Ag, Sn-Au, Sn-Cu, Sn-Bi, Sn-Zn, Sn-Ag-Cu, Sn-Ag-Bi, Sn-Ag-Zn, Sn-Cu-Bi, Sn-Cu-Zn, Sn-Bi-Zn, etc.

The memory chip 100 may be stacked on the interface chip 200. In the semiconductor package 1000 of the present embodiment, one memory chip 100 is stacked on the interface chip 200, but the number of memory chips 100 stacked on the interface chip 200 is not limited thereto. For example, a plurality of memory chips 100 may be stacked on the interface chip 200. The stacking of the plurality of memory chips 100 is described below in more detail with reference to FIG. 8.

The memory chip 100 may include a substrate 101, a second TSV 110, a device layer 120, a second pad 130, the second bump 140, and a dummy bump 140D. Here, the substrate 101 is as described above with respect to the substrate 201 of the interface chip 200. The second TSV 110 may be formed to penetrate through the substrate 101 entirely or partially. Moreover, when the memory chip 100 is stacked on the top of the semiconductor package 1000, the second TSV 110 and an upper pad 112 may be omitted.

The device layer 120 of the memory chip 100 may include a plurality of memory devices. For example, the device layer 120 may include volatile memory devices like a DRAM and SRAM or non-volatile memory devices like PRAM, MRAM, FeRAM, or RRAM. For example, in the semiconductor package 1000 of the present embodiment, the memory chip 100 may include DRAM devices in the device layer 120. Therefore, the semiconductor package 1000 of the present embodiment may be used in a high bandwidth memory (HBM) product or an electro date processing (EDP) product.

A wire layer 135 may be provided on the bottom surface of the substrate 101. The wire layer 135 may include a plurality of wire structures. For example, the wire structure may connect devices of the device layer 120, connect the devices to a conductive region of the substrate 101, or electrically connect the devices and the second TSV 110 to the second bump 140 via the second pad 130.

The second pad 130 may be provided on the bottom surface of the substrate 101 and may be provided to be electrically connected to the second TSV 110 and/or the device layer 120. The shape and the material of the second pad 130 are the same as those described above for the first pad 230 of the interface chip 200. The second pad 130 may include a dummy pad 130P$d$ provided inside the memory chip 100 and a second test pad 130P$t$ provided at an outer portion of the memory chip 100. As shown in FIG. 1B, the dummy pad 130P$d$ may be a pad on which the first dummy bump 140D1 is provided, and the second test pad 130P$t$ may be a pad for an electrical test on the memory chip 100. Here, the dummy pad 130P$d$ and the first dummy bump 140D1 may refer to a pad and a bump that are not configured to perform electronic functions such as transmit signals or power.

In the semiconductor package 1000, according to the present disclosure, the first pad 230 of the interface chip 200 and the second pad 130 of the memory chip 100 may be formed through the same process or similar processes. Therefore, the position of the first pad 230 in the interface chip 200 may be substantially the same as the position of the second pad 130 in the memory chip 100. In detail, the bump pad 230Pb and the dummy pad 130Pd corresponding thereto may be provided at the same position inside the corresponding chips. Therefore, after the memory chip 100 is stacked on the interface chip 200, the bump pad 230Pb and the dummy pad 130Pd corresponding thereto are arranged at the same position in a first direction (x-direction) and a second direction (y-direction) and may overlap each other. Additionally, the first test pad 230Pt and the second test pad 130Pt corresponding thereto may be provided at the same position on the outer portion of the corresponding chips. Therefore, the first test pad 230Pt and the second test pad 130Pt corresponding thereto are arranged at the same position in a first direction (x-direction) and a second direction (y-direction) and may overlap each other after the memory chip 100 is stacked on the interface chip 200.

As shown in FIG. 1B, there may be damage on the top surfaces of the first test pad 230Pt and the second test pad 130Pt. Such damage may be marks formed due to contact with a probe pin, such as a pogo pin, during a test using the first test pad 230Pt and the second test pad 130Pt. Due to such damage, bumps may not be provided on the top surfaces of the first test pad 230Pt and the second test pad 130Pt. Therefore, in the semiconductor package 1000 of the present embodiment, the first test pad 230Pt and the second test pad 130Pt may be kept open without being used as data transmitting paths.

Moreover, in the semiconductor package 1000 of the present embodiment, the first bump 240 is provided on the bump pad 230Pb to serve as a data transmitting path, but a first dummy bump 140D1 provided on the dummy pad 130Pd may not be used as a data transmitting path. In other words, as shown in FIG. 1B, the first dummy bump 140D1 is provided at a lower portion of the dummy pad 130Pd, but the first dummy bump 140D1 may not be electrically connected to the dummy pad 130Pd. Additionally, the first dummy bump 140D1 may not be connected to a conductive portion of the interface chip 200 provided thereon. The first dummy bump 140D1 may be provided to control the flowability of the adhesive layer 150 described below.

Moreover, the dummy pad 130Pd may be formed in a closed structure, not connected to the first dummy bump 140D1. On the contrary, the bump pad 230Pb may be formed in an open structure for electrical connection with the first bump 240. The process for forming the dummy pad 130Pd is similar to the process for forming the bump pad 230Pb, but there may be slight differences in whether to perform an opening process. For example, in the case of the interface chip 200, an opening process for exposing the bottom surface of the bump pad 230Pb is performed after a passivation layer covering the bump pad 230Pb is formed. However, in the case of the memory chip 100, an opening process may be omitted after a passivation layer covering the dummy pad 130Pb is formed. Here, the passivation layer may include an insulating layer including photosensitive polyimide (PSPI), SiN, tetraethyl orthosilicate (TEOS), etc. Of course, the material constituting the passivation layer is not limited to the above materials.

The second bump 140 is provided on the second TSV 110 of the bottom surface of the memory chip 100 and may be electrically connected to devices of the device layer 120 and/or the second TSV 110 through wire structures of the wire layer 135. The second bump 140 may include, for example, a pillar 141 and a solder layer 143. However, in some embodiments, the second bump 140 may include a solder layer. Moreover, as shown in FIG. 1B, the second bump 140 may be connected to the upper pad 212. Therefore, the second TSV 110 may be electrically connected to the first TSV 210 through the second bump 140 and subsequently electrically connected to the first bump 240 through the wire structures of the wire layer 235.

The dummy bump 140D may include a first dummy bump 140D1 and a second dummy bump 140D2. As described above, the first dummy bump 140D1 may refer to a dummy bump provided on the dummy pad 130Pd. Alternatively, the second dummy bump 140D2 may refer to a dummy bump provided between the second test pad 130Pt and the second bump 140. Here, a dummy bump may refer to a bump that does not perform an electronic function such as transmitting electrical signals or power.

As shown in FIG. 1B, in the memory chip 100 of the semiconductor package 1000 of the present embodiment, the dummy bumps 140D may be arranged on both sides of the second TSV 110 or the second bump 140 in the first direction (x-direction). In detail, around the second TSV 110, the first dummy bump 140D1 may be provided in an inner portion of the memory chip 100, and the second dummy bump 140D2 may be provided in an outer portion of the memory chip 100, in the first direction (x-direction).

Moreover, as shown in FIG. 1A, in the memory chip 100 of the semiconductor package 1000 of the present embodiment, second TSVs 110 may be arranged in two columns in the second direction (y-direction). Additionally, the dummy pad 130Pd and the second test pad 130Pt may be arranged on both sides of each second TSV 110 in the first direction (x-direction). Although not shown in FIG. 1A, the first dummy bump 140D1 may be provided on the dummy pad 130Pd, and the second dummy bump 140D2 may be provided between the second TSV 110 and the second test pad 130Pt. Alternatively, in the semiconductor package 1000 of the present embodiment, the arrangement structure of the second TSVs 110 is not limited to the two-column structure. For example, the second TSVs 110 may be arranged in three or more columns in the second direction (y-direction).

In the semiconductor package 1000 of the present embodiment, the dummy bump 140D may be provided to minimize the flowability of the adhesive layer 150 (e.g., a non-conductive film (NCF)) when the memory chip 100 is stacked on the interface chip 200 by using a temperature-compression bonding (TCB) method. In the semiconductor package 1000 of the present embodiment, the dummy bump 140D may be arranged with a set rule instead of being arbitrarily arranged. At least some of the first dummy bumps 140D1 and the second dummy bumps 140D2 may not be arranged when the set rule is not satisfied. The arrangement rule of the dummy bumps 140D is described below in more detail with reference to FIGS. 4A and 4B.

The adhesive layer 150 may be between the interface chip 200 and the memory chip 100 to surround side surfaces of the second bump 140 and the dummy bump 140D. As shown in FIG. 1B, the adhesive layer 150 may have a structure protruding outward from side surfaces of the interface chip 200 and the memory chip 100. The adhesive layer 150 may include, for example, an NCF mainly used when the memory chip 100 is stacked by using the TCB method. However, the material of the adhesive layer 150 is not limited to the NCF. For example, the adhesive layer 150 may include a material capable of flowing with fluidity in the TCB method.

Due to the property that the adhesive layer 150 flows with fluidity in the TCB type adhesion, when semiconductor chips are stacked by using the TCB method, short circuits between adjacent bumps or poor contacts between bumps and upper pads may occur. However, in the semiconductor package 1000 of the present embodiment, as the dummy bumps 140D are provided between the second bumps 140 (when memory chips 100 are stacked on the interface chip 200 by using the TCB method) the flowability of the adhesive layer 150 is minimized, thereby preventing the above-described problems. As a result, the reliability of the semiconductor package 1000 may be increased. Problems due to the flowability of the adhesive layer 150 and a prevention method is described below in more detail with reference to FIGS. 2A to 3B.

Additionally, in the semiconductor package 1000 of the present embodiment, the first pad 230 of the interface chip 200 and the second pad 130 of the memory chip 100 have substantially the same shape and may be arranged at the same position in a horizontal direction and overlap each other. Accordingly, first pads 230 of the interface chip 200 and second pads 130 of the memory chip 100 may be formed through similar processes, thereby simplifying respective chip fabrication processes and an entire semiconductor package fabricating process and, ultimately, reducing cost and time for fabricating the semiconductor package.

Moreover, the semiconductor package 1000 according to the present embodiment may further include a printed circuit board (PCB) (see PCB 300 of FIG. 7) on which interface chips 200 are stacked and a sealant (400 of FIG. 7) for sealing the interface chips 200 and the memory chips 100. A detailed description thereof is given below with reference to FIG. 7.

Thus, according to another aspect of the inventive concept, a semiconductor device comprises a first chip (e.g., the interface chip 100); a second chip (e.g., memory chip 100); one or more bumps between the first chip and the second chip (e.g., second bump 140), wherein each of the one or more bumps electronically connect the first chip and the second chip; and one or more dummy bumps between the first chip and the second chip (e.g., dummy bump 140D), wherein the one or more dummy bumps are configured to reduce a flow rate of a NCF during a TCB process, and wherein the one or more dummy bumps do not electronically connect the first chip and the second chip.

In some cases, the first chip comprises a one or more TSVs (e.g., TSV 210), where each of the one or more TSVs is connected to one of the one or more bumps. In some cases, the semiconductor device includes one or more bump pads (e.g., bump pad 230Pb) on a first surface of the first chip, where the first surface is opposite to a second surface adjacent to the one or more bumps; and one or more additional bumps (e.g., first bump 240) connected to the one or more bump pads.

Figure 2A:
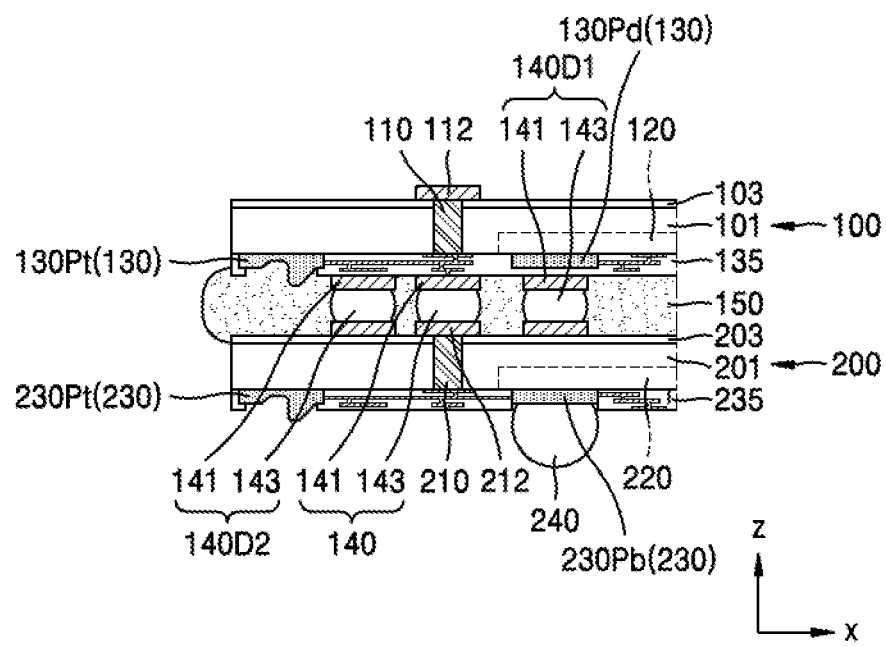
FIGS. 2A and 2B are a partial cross-sectional view of an outer portion of the semiconductor package of FIG. 1A and a conceptual view of the flowing of a non-conductive film (NCF)
Figure 2B:
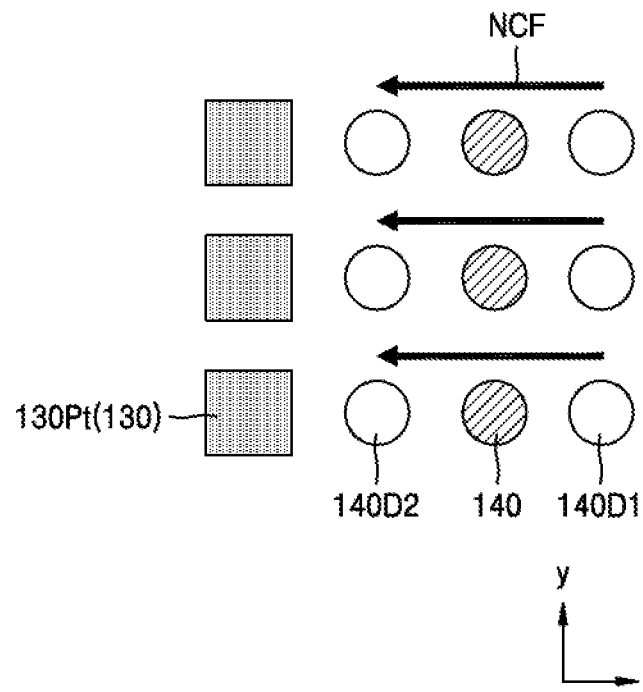

FIGS. 2A and 2B are a partial cross-sectional view of an outer portion of the semiconductor package of FIG. 1A and a conceptual view of the flowing of an NCF. Descriptions of FIGS. 2A and 2B are given below with reference to FIGS. 1A and 1B. Descriptions above with reference to FIGS. 1A and 1B are briefly given or omitted.

Referring to FIGS. 2A and 2B, FIG. 2A shows a left portion of the semiconductor package 1000 of the present embodiment, wherein, in the first direction (x-direction), the first dummy bump 140D1, the second bump 140, the second dummy bump 140D2, and the second test pad 130Pt may be arranged from the center of the memory chip 100 toward the outside of the memory chip 100. Alternatively, FIG. 2B shows a direction in which the adhesive layer 150, e.g., an NCF, flows during a stacking process by using the TCB method with an arrow. In other words, in the stacking process by using the TCB method, the NCF may flow from the first dummy bump 140D1 toward the second test pad 130Pt in the first direction (x-direction).

Note that, a flow of the NCF occurs when an NCF is used to stack a semiconductor chip on another semiconductor chip by using the TCB method. As a result, a solder of a bump provided between semiconductor chips may be swept due to the flow of the NCF. To describe the flowability of an NCF in adhesion by using the TCB method in more detail, generally, an adhering process by using the TCB method may be performed by bringing an upper semiconductor chip close to a lower semiconductor chip with a certain pressure at a high temperature, e.g., from about 200° C. to about 300° C., such that a bump of the upper semiconductor chip is coupled to an upper pad of the lower semiconductor chip. In such an adhering process using the TCB method, an NCF and a solder layer of a bump may have fluidity by being melted. An integrated NCF flows from the center portion of an upper semiconductor chip or a lower semiconductor chip toward the outer portion in the concentric direction in an adhering process by using the TCB method. The solder layer of the bump also has fluidity. As a result, the solder layer of the bump may also flow toward the outer portion along with the flow of the NCF since. As a result, a solder sweeping phenomenon may occur.

Alternatively, when an adhering process by using the TCB method is performed without an NCF, a solder layer of a bump flows symmetrically around a corresponding upper pad. Therefore, there may be no serious problem. However, when an adhering process by using the TCB method is performed without an NCF, coupling force may be weak. Therefore, a lower semiconductor chip and an upper semiconductor chip may be separated later due to factors like warpage. As a result, the reliability of a semiconductor package may deteriorate.

Therefore, in an adhering process by using the TCB method, an adhesive layer like an NCF may be generally provided between a lower semiconductor chip and an upper semiconductor chip. However, the solder sweeping phenomenon occurs due to the fluidity of an NCF during an adhering process by using the TCB method as described above. The solder sweeping phenomenon may be maximized in the outer portions of the lower semiconductor chip and the upper semiconductor chip. Accordingly, a short circuit may occur, in which adjacent solder layers stick to each other, and/or there is poor contact between a solder and an upper pad due to a large amount of solder flow of a solder layer.

In the semiconductor package 1000 of the present embodiment, since the first dummy bump 140D1 and the second dummy bump 140D2 are arranged on both sides of the second bump 140 in the first direction (x-direction), the flowability of an NCF becomes weak. Therefore, sweeping of the solder layer 143 of the second bump 140 may be minimized. Therefore, the occurrence of a short circuit between adjacent bumps and a poor contact between the bump and the upper pad may be solved.

Figure 3A:
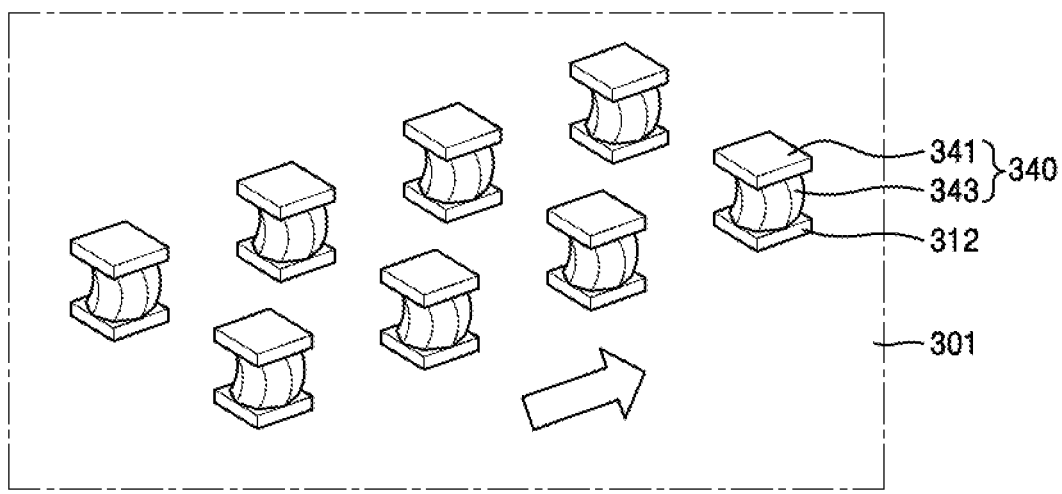
FIGS. 3A and 3B are conceptual views for describing an arrangement structure of bumps and the flowability of an NCF.
Figure 3B:
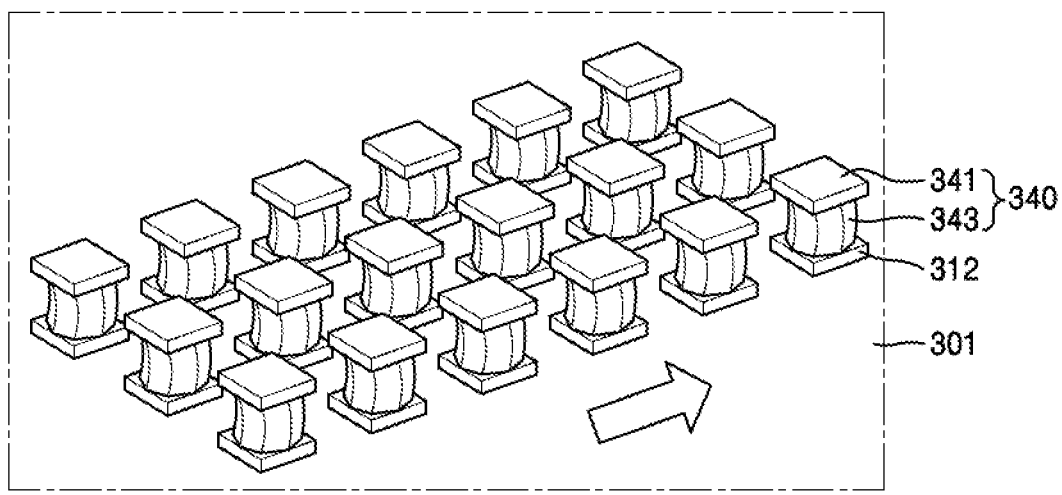

FIGS. 3A and 3B are conceptual views for describing an arrangement structure of bumps and the flowability of an NCF.

Referring to FIGS. 3A and 3B, bumps 340 may be provided on a substrate 301, wherein the bumps 340 of FIG.

3B may be arranged more densely than the bumps 340 of FIG. 3A. Here, the bumps 340 may have the same size or different sizes and may be actual bumps or dummy bumps. It is assumed that an NCF flows in the direction indicated by the arrow. When a fluid flows across a substrate 301, it may flow relatively quickly through a wide passage and flow more slowly through a narrow passage. In other words, when the bumps 340 are densely arranged as shown in FIG. 3B, passages through which the NCF flows are more narrow. Therefore, the NCF may flow relatively slowly and the flowability of the NCF may be reduced. Alternatively, when the bumps 340 are sparsely arranged as shown in FIG. 3A, passages through which the NCF flows are wider. Therefore, the NCF may flow more quickly and the flowability of the NCF may be relatively high.

The flowability of an NCF may be reduced by densely arranging bumps in a direction in which the NCF flows or a direction perpendicular thereto. The flowability of an NCF may be further reduced by arranging bumps 2-dimensionally. For example, in some cases the NCF flows in radial directions from the center of the memory chip 100, not in one direction. Therefore, arranging bumps 2-dimensionally may minimize passages through which the NCF flows.

Figure 4A:
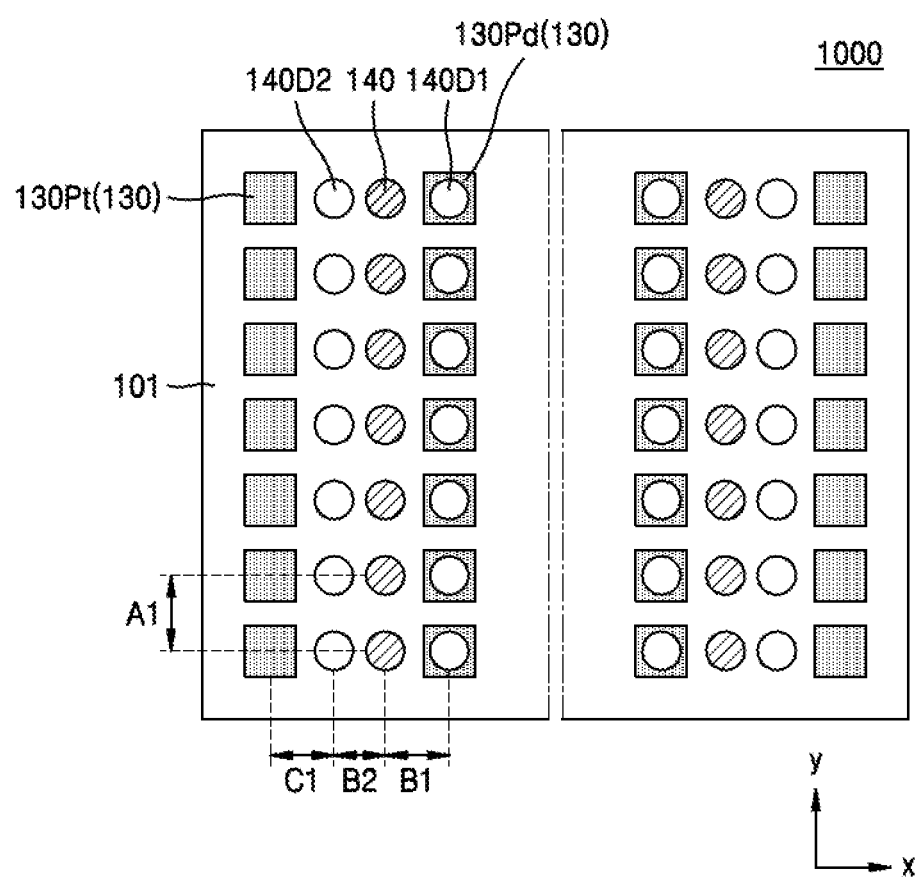
FIGS. 4A and 4B are conceptual views for describing a pitch between bumps, a gap between bumps and dummy bumps, and a gap between test pads and the dummy bumps in relation to an arrangement of the dummy bumps in a semiconductor package according to an embodiment of the inventive concept.
Figure 4B:
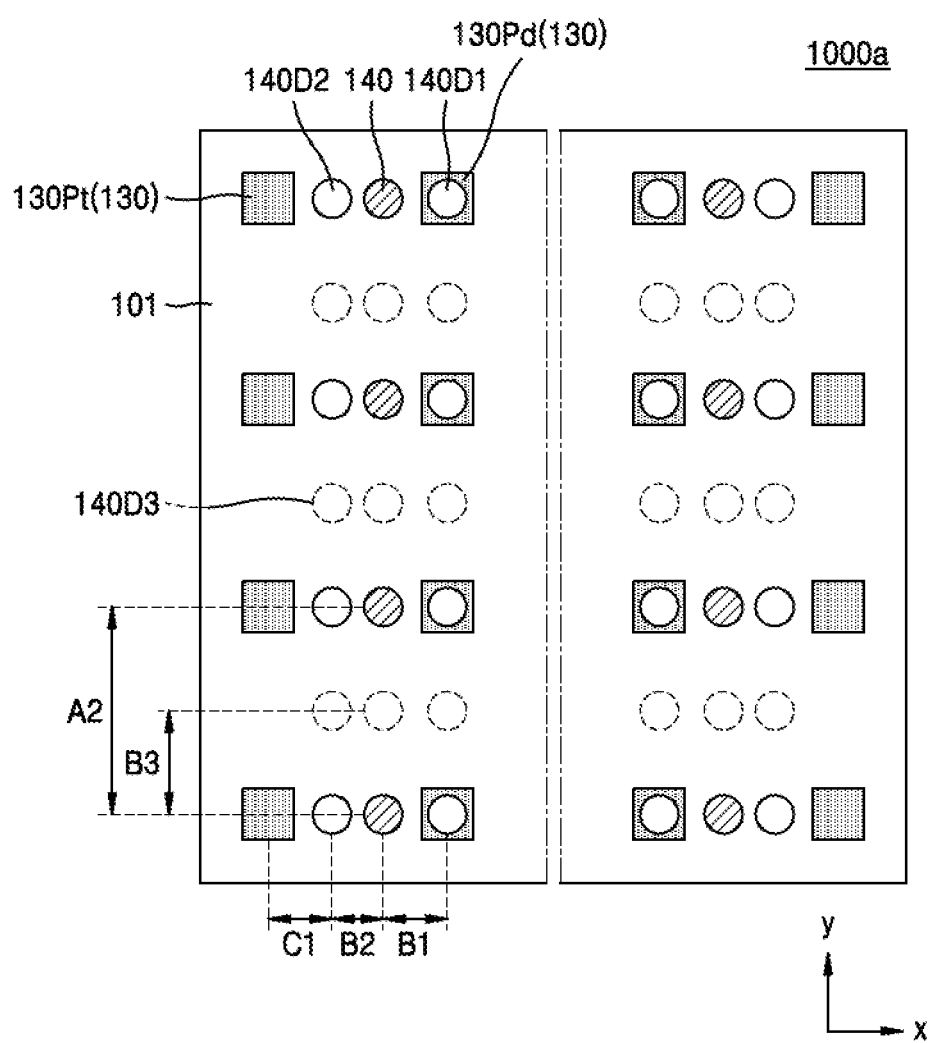

FIGS. 4A and 4B are conceptual views for describing a pitch between bumps, a gap between bumps and dummy bumps, and a gap between test pads and the dummy bumps in relation to an arrangement of the dummy bumps in a semiconductor package according to an embodiment of the inventive concept. Descriptions above with reference to FIGS. 1A to 3B are briefly given or omitted.

Referring to FIG. 4A, in the semiconductor package 1000 of the present embodiment, a minimum pitch between second TSVs (see TSV 110 of FIG. 1B) of the memory chip 100 is denoted as A0. The minimum pitch A0 between the second TSVs 110 may be determined based on the arrangement structure of devices and wires included in the memory chip 100, the difficulty of a TSV forming process, the size of bumps, etc. The minimum pitch A0 related to the size of bumps is described below in more detail with reference to FIG. 5.

In the semiconductor package 1000 of the present embodiment, the minimum pitch A0 of the second TSVs 110 may be about several tens of μm. For example, in the semiconductor package 1000 of the present embodiment, the minimum pitch A0 of the second TSVs 110 may be from about 20 μm to about 30 μm. Moreover, since the second bumps 140 are arranged at positions corresponding to those of the second TSVs 110, the second bumps 140 may have the minimum pitch A0 that may be substantially the same as that of the second TSVs 110.

In FIG. 4A, although the second bumps 140 are shown for convenience of explanation, the second TSVs 110 may be are arranged at substantially the same positions as those of the second bumps 140. Therefore, descriptions is given below for the arrangement rule of the dummy bumps 140D based on the second bumps 140. However, the arrangement rule may be substantially the same as that described above based on the second TSV 110.

In the semiconductor package 1000 of the present embodiment, rules for arranging the dummy bumps 140D are as follows. When a distance or a gap from the second bump 140 to the dummy bump 140D is denoted as Bi (where i is a natural number), the minimum pitch A0 and the gap Bi may satisfy the following Inequality (1).

$$A0 \le Bi \le 2*A0 \ldots \quad \text{Inequality (1)}$$

Here, the gap Bi may be defined as a distance between the center of the second bump 140 and the center of the dummy bump 140D. In FIG. 4A, a first pitch A1 between the second bumps 140 in the second direction (y-direction) may be greater than the minimum pitch A0. However, the first pitch A1 may be less than twice the minimum pitch A0. Therefore, no dummy bump may be arranged between the second bumps 140 in the second direction (y-direction). Moreover, in the first direction (x-direction), a first gap B1 between the second bump 140 and the first dummy bump 140D1 may satisfy Inequality (1). Additionally, a second gap B2 between the second bump 140 and the second dummy bump 140D2 may also satisfy Inequality (1).

Moreover, the minimum pitch A0 and the gap Ci may satisfy the following Inequality (2) when a gap between the second test pad 130P$t$ and the dummy bump 140D adjacent thereto are denoted as Ci (i is a natural number).

$$A0 \le Ci \ldots \quad \text{Inequality (2)}$$

In FIG. 4A, the first gap C1 between the second test pad 130P$t$ and the second dummy bump 140D2 may satisfy Inequality (2).

As long as the rules of Inequality (1) and Inequality (2) are satisfied, the dummy bumps 140D may be provided on the memory chip 100 in various arrangement structures. For example, when a gap between the second test pad 130P$t$ and the second bump 140 in the first direction (x-direction) is more than three times the minimum pitch A0, two dummy bumps 140D may be arranged in the first direction (x-direction) while Inequality (1) and Inequality (2) are satisfied. Moreover, although there is no particular rule for a gap between adjacent dummy bumps 140D, considering factors including the difficulty of a bump forming process, the adjacent dummy bumps 140D may be arranged based on the gap Bi satisfying Inequality (1).

Referring to FIG. 4B, in a semiconductor package 1000$a$ of the present disclosure, a second pitch A2 between the second bumps 140 in the second direction (y-direction) may be twice the minimum pitch A0 or greater. Therefore, third dummy bumps 140D3 may be arranged in the second direction (y-direction). As a result, a third gap B3 between the second bump 140 and a third dummy bump 140D3 in the second direction (y-direction) may satisfy Inequality (1).

Moreover, as shown in FIG. 4B, the third dummy bumps 140D3 may be also arranged between the first dummy bumps 140D1 and between the second dummy bumps 140D2 in the second direction (y-direction). However, the dummy pads 130P$d$ may not be arranged between the first dummy bumps 140D1. In other words, the first dummy bumps 140D1 are arranged at positions corresponding to those of the dummy pads 130P$d$, but the third dummy bumps 140D3 may be arranged regardless of the dummy pads 130P$d$. Furthermore, in some embodiments, the third dummy bumps 140D3 may also be arranged between the second test pads 130P$t$ in the second direction (y-direction).

Figure 5:
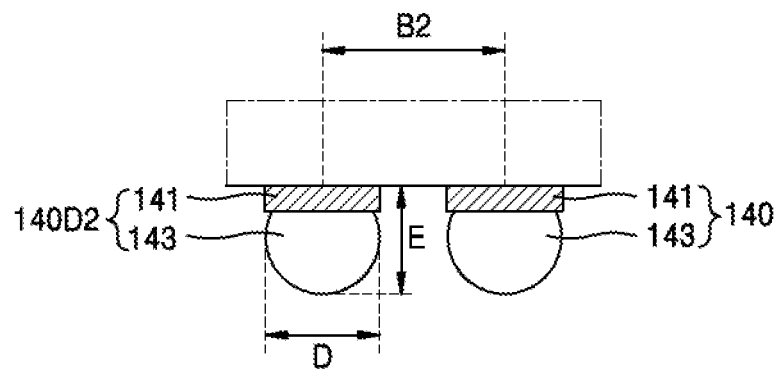
FIG. 5 is a cross-sectional view for describing a pitch between bumps or a gap between a bump and a dummy bump in relation to the size of a bump or a dummy bump in the semiconductor package of FIG. 1A.

FIG. 5 is a cross-sectional view of a pitch between bumps or a gap between a bump and a dummy bump related to the size of a bump or a dummy bump in the semiconductor package of FIG. 1A.

Referring to FIG. 5, in the semiconductor package 1000 of the present embodiment, the sizes of the second bump 140 and the dummy bump 140D (e.g., the second dummy bump 140D2) may be substantially the same. For example, the second bump 140 and the second dummy bump 140D2 may have substantially the same width or diameter D in the first direction (x-direction). Here, the width may be defined when the second bump 140 and the second dummy bump 140D2 have a polygonal pillar shape, whereas the diameter may be defined when the second bump 140 and the second dummy bump 140D2 have a ball-like shape or a cylindrical shape. Additionally, the second bump 140 and the second dummy bump 140D2 may have substantially the same height E in a third direction (z-direction). Therefore, descriptions are given below based on the second bump 140.

The minimum pitch A0 between the second bumps 140 may be at least 1.5 times the diameter D of the second bump 140. The risk of a short circuit increases when the minimum pitch A0 between the second bumps 140 is too small compared to the diameter D of the second bump 140. On the contrary, when the minimum pitch A0 between the second bumps 140 is too large, the flowability of an NCF increases. Therefore, problems associated with solder sweeping may occur. Once the minimum pitch A0 between the second bumps 140 is defined, a gap between the second bump 140 and the dummy bump 140D, e.g., a second gap Bi between the second bump 140 and the second dummy bump 140D2, may satisfy Inequality (1). Therefore, the gap between the second bump 140 and the dummy bump 140D may also be 1.5 times or greater than the diameter D of the second bump 140.

Moreover, the height E of the second bump 140 may be 0.5 times or greater than and 1.5 times or less that the diameter D of the second bump 140. Of course, the height E of the second bump 140 is not limited to the above range. The height E of the second bump 140 may affect the flowability of an NCF. Additionally, the height E of the second bump 140 may affect adhesion between the interface chip 200 and the memory chip 100, warpage, etc.

Figure 6A:
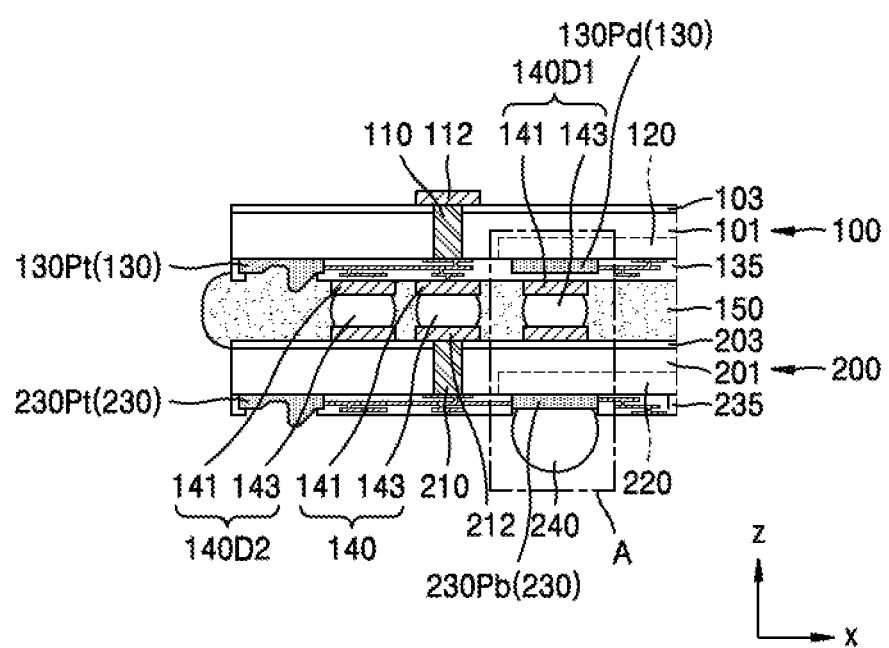
FIGS. 6A through 6C are a partial cross-sectional view of an outer portion of the semiconductor package of FIG. 1A and cross-sectional views of structures of an open pad and a closed pad.
Figure 6B:
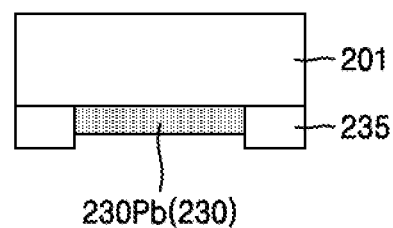
Figure 6C:
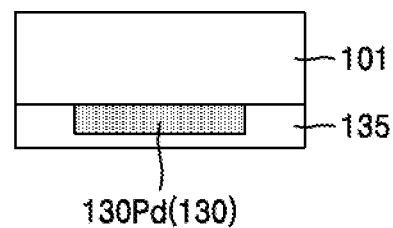

FIGS. 6A through 6C are a partial cross-sectional view of an outer portion of the semiconductor package of FIG. 1A and cross-sectional views of structures of open and closed pads. Descriptions above with reference to FIGS. 1A to 5 are briefly given or omitted.

Referring to FIGS. 6A to 6C, in the semiconductor package 1000 of the present embodiment, the dummy pad 130Pd and the bump pad 230Pb may be arranged at substantially the same position in the first direction (x) and the second direction (y-direction) as indicated by the dashed-dot line rectangle A of FIG. 6A. Additionally, the dummy pad 130Pd and the bump pad 230Pb may have substantially the same size. Therefore, the dummy pad 130Pd and the bump pad 230Pb may overlap each other.

However, the bump pad 230Pb may be formed in an open structure, whereas the dummy pad 130Pd may be formed in a closed structure. For example, as shown in FIGS. 6B and 6C, as the bump pad 230Pb is formed in an open structure, the bottom surface thereof may be exposed, whereas the bottom surface of the dummy pad 130Pd may be covered by a passivation layer and may not be exposed. Moreover, in FIGS. 6B and 6C, the passivation layer is included in the wire layer 135 without being distinguished.

The dummy pad 130Pd and the bump pad 230Pb may be formed through substantially similar processes. However, in a process for forming the bump pad 230Pb, an opening process for exposing the bottom surface of the bump pad 230Pb by removing a portion of a passivation layer may be performed. However, an opening process may be omitted in a process for forming the dummy pad 130Pd.

Moreover, the first dummy bump 140D1 may be provided below the dummy pad 130Pd, and the first bump 240 may be provided on the bottom surface of the bump pad 230Pb. Since the dummy pad 130Pd is in a closed state, the dummy pad 130Pd and the first dummy bump 140D1 may not be electrically connected. On the contrary, since the bump pad 230Pb is in an opened state and the first bump 240 is provided directly on the bottom surface of the bump pad 230Pb, the bump pad 230Pb and the first bump 240 may be electrically connected.

Additionally, generally, the size of the first bump 240 provided on the interface chip 200 may be greater than the size of the second bump 140 or the dummy bump 140D provided on the memory chip 100. Since the first bump 240 has a relatively large size, there may be no significant problem even when the first bump 240 is provided on the first test pad 230Pt. Therefore, an existing semiconductor package may have a structure in which a test pad may be provided in an inner portion of an interface chip, and, after the test, a bump is still attached onto the test pad despite damage of the test pad. In other words, in the case of the existing semiconductor package, the test pad may also perform the function of a bump pad.

Alternatively, in an existing semiconductor package, a test pad of a memory chip may be formed through the same process to have the same size as a test pad of an interface chip. Therefore, attaching a small dummy bump to the test pad of the memory chip after a test may be difficult. When the position of a test pad of the memory chip is changed to attach a dummy bump, the position of the test pad of the memory chip and the position of the test pad of the interface chip are different. Therefore, a pad forming process may become complicated.

In the semiconductor package 1000 of the present embodiment, both the first test pad 230Pt of the interface chip 200 and the second test pad 130Pt of the memory chip 100 are arranged at substantially the same position in the outer portions of respective chips. Additionally, both the bump pad 230Pb of the interface chip 200 and the dummy pad 130Pd of the memory chip 100 are arranged at substantially the same positions in the inner portions of the respective chips. As a result, while a pad forming process is simplified, the first dummy bump 140D1 may be attached to the lower portion of the dummy pad 130Pd of the memory chip 100.

Figure 7:
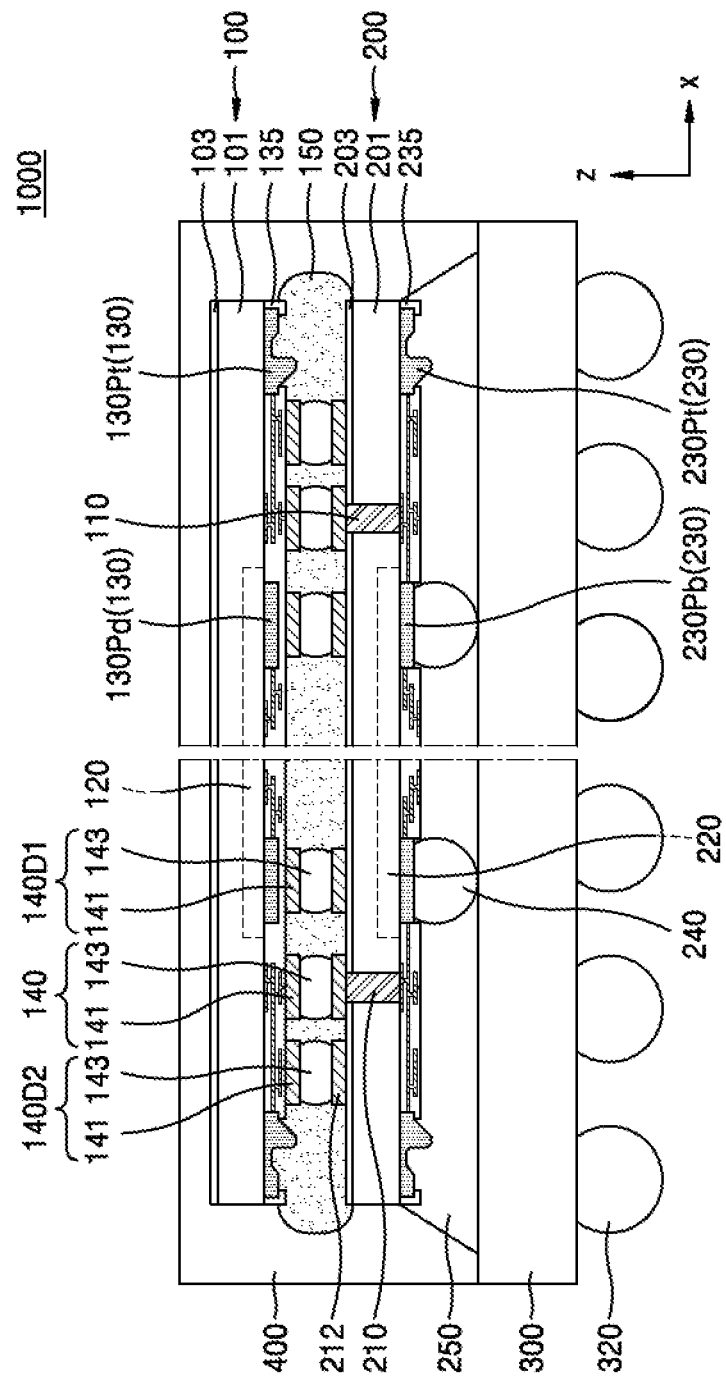
FIGS. 7 and 8 are cross-sectional views of semiconductor packages according to an embodiment of the inventive concept.
Figure 8:
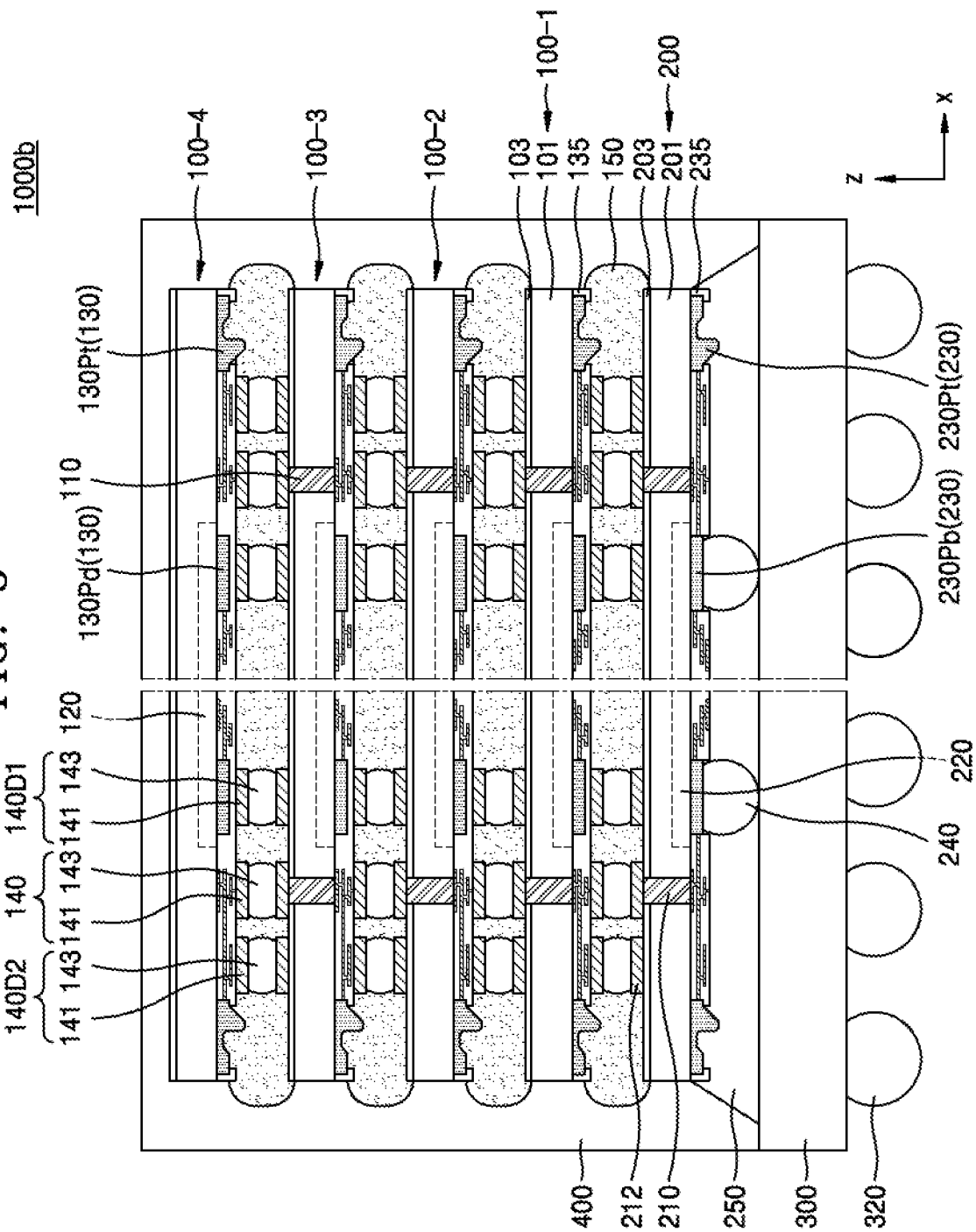

FIGS. 7 and 8 are cross-sectional views of semiconductor packages according to an embodiment of the inventive concept. Descriptions above with reference to FIGS. 1A to 6B are briefly given or omitted.

Referring to FIG. 7, the semiconductor package 1000 of the present embodiment may be similar to the semiconductor package 1000 of FIG. 1A. However, in the semiconductor package 1000 of the present embodiment, the PCB 300 is provided below the interface chip 200, and the sealant 400 covering the interface chip 200 and the memory chip 100 are shown. Moreover, the second TSV 110 in the memory chip 100 may be omitted.

In detail, in the semiconductor package 1000 of the present embodiment, the interface chip 200 may be stacked on the PCB 300. An outside connecting member 320, e.g., a solder ball, may be attached to the bottom surface of the PCB 300. A wire layer may be provided in the PCB 300, and the outside connecting member 320 and the first bump 240 may be electrically connected through the wire layer. The wire layer may have, for example, a single layer wire structure or a multilayer wire structure. Moreover, in some embodiments, a via electrode may be provided in the PCB 300. In such a structure, the outside connecting member 320 and the first bump 240 may be electrically connected through the via electrode and the wire layer.

The interface chip 200 may be stacked on the PCB 300 through the first bump 240 and the underfill 250. The underfill 250 may fill a space between the PCB 300 and the interface chip 200 and may partially cover side surfaces of the interface chip 200. The underfill 250 may include an underfill resin like an epoxy resin, for example, and may include a silica filler, a flux, etc. In some embodiments, an adhesive layer like an NCF may be used instead of the underfill 250 to stack the interface chip 200. Problems due to the flowability of the NCF may also occur when stacking the interface chip 200 on the PCB 300 via an NCF by using the TCB method. A dummy bump may be attached to the bottom surface of the interface chip 200 to prevent such problems.

Moreover, since no other memory chip is stacked on the memory chip 100, no TSV may be formed in the memory chip 100. However, the second bump 140 may be electrically connected to devices of the device layer 120 through the wire structure of the wire layer 135.

The sealant 400 may cover side surfaces of the interface chip 200, the memory chip 100, the adhesive layer 150, and the underfill 250. Additionally, the sealant 400 may cover the top surface of the memory chip 100 with a certain thickness. However, in some embodiments, the sealant 400 may not cover the top surface of the memory chip 100, and the top surface of the memory chip 100 may be exposed to the outside from the sealant 400. The sealant 400 may include, for example, an epoxy mold compound (EMC). Of course, the material of the sealant 400 is not limited to the EMC.

Referring to FIG. 8, in a semiconductor package 1000*b* of the present embodiment, four memory chips 100-1 to 100-4 are stacked on the interface chip 200, unlike in the semiconductor package 1000 of FIG. 7. In detail, in the semiconductor package 1000*b* of the present embodiment, a first memory chip 100-1, a second memory chip 100-2, a third memory chip 100-3, and a fourth memory chip 100-4 may be sequentially stacked on the interface chip 200. The structure of each the first memory chip 100-1, the second memory chip 100-2, the third memory chip 100-3, and the fourth memory chip 100-4 is substantially the same as that of the memory chip 100 of the semiconductor package 1000 of FIG. 7. For example, each of the first memory chip 100-1, the second memory chip 100-2, the third memory chip 100-3, and the fourth memory chip 100-4 may include the second test pad 130P*t* provided in an outer portion, the dummy pad 130P*d* provided in an inner portion, and the dummy bump 140D provided while satisfying Inequality (1) and Inequality (2).

Moreover, each of the first memory chip 100-1, the second memory chip 100-2, the third memory chip 100-3, and the fourth memory chip 100-4 may be stacked on a corresponding chip via the adhesive layer 150 like an NCF by using the TCB method. For example, the first memory chip 100-1 may be stacked on the interface chip 200 via the adhesive layer 150 by using the TCB method, and the second memory chip 100-2 may be stacked on the first memory chip 100-1 via the adhesive layer 150 by using the TCB method. Additionally, the third memory chip 100-3 and the fourth memory chip 100-4 may be stacked on underlying layers corresponding thereto, such as the second memory chip 100-2 and the third memory chip 100-3 via adhesive layers 150 by using the TCB method, respectively.

Moreover, a TSV may not be formed in the fourth memory chip 100-4 since no other memory chip is stacked on the fourth memory chip 100-4. The sealant 400 may cover side surfaces of the interface chip 200, the first memory chip 100-1, the second memory chip 100-2, the third memory chip 100-3, the fourth memory chip 100-4, the adhesive layers 150, and the underfill 250 on the PCB 300.

In some embodiments, the top surface of the fourth memory chip 100-4 may not be covered by the sealant 400. In this case, the top surface of the fourth memory chip 100-4 may be exposed. Moreover, the semiconductor package 1000*b* of the present embodiment has a structure in which the four memory chips 100-1 to 100-4 are stacked on the interface chip 200, but the number of stacked memory chips is not limited to four. For example, three, five, or more memory chips may be stacked on the interface chip 200.

The semiconductor package 1000*b* of the present embodiment may also solve problems like a short circuit or a poor contact by minimizing the flowability of the adhesive layer 150 like an NCF through an arrangement of the dummy bump 140D. Additionally, a pad forming process may be simplified based on the arrangement positions of the second test pad 130P*t* and the dummy pad 130P*d*. Additionally, the dummy bump 140D may be provided on the bottom surface of the dummy pad 130P*d*.

FIGS. 9A through 9D are cross-sectional views briefly showing a process of fabricating the semiconductor package of FIG. 1A, according to an embodiment of the inventive concept. Descriptions of FIGS. 9A to 9D are given below with reference to FIGS. 1A and 1B, and descriptions above with reference to FIGS. 1A and 8 are briefly given or omitted.

Figure 9A:
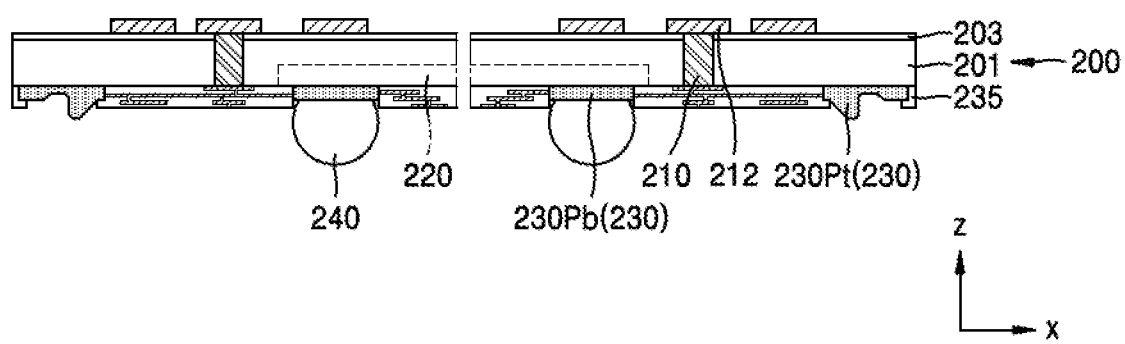
FIGS. 9A through 9D are cross-sectional views briefly showing a process of fabricating the semiconductor package of FIG. 1A, according to an embodiment of the inventive concept.

Referring to FIG. 9A, in the method of manufacturing a semiconductor package of the present embodiment, the interface chip 200 is prepared first. The structure of the interface chip 200 is the same as that described above with reference to FIGS. 1A and 1B. The preparation of the interface chip 200 is described below in more detail with reference to FIGS. 10A to 10E.

Figure 9B:
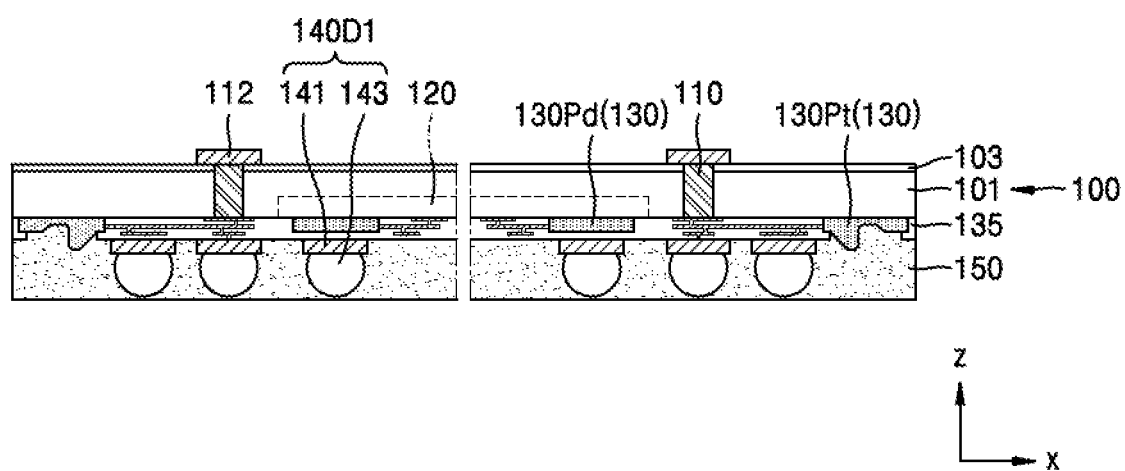

Referring to FIG. 9B, the memory chip 100 is prepared. The structure of the memory chip 100 is the same as that described above with reference to FIGS. 1A and 1B. However, when the memory chip 100 is a memory chip stacked on the top of the semiconductor package, the memory chip 100 may not include a TSV. The preparation of the memory chip 100 is described below in more detail with reference to FIGS. 11A to 11E.

Moreover, the adhesive layer 150 covering the second bump 140, the dummy bump 140D, and the second test pad 130P*t* may be attached to the bottom surface of the memory chip 100. For example, the adhesive layer 150 may be an NCF. The adhesive layer 150 may be attached when the memory chip 100 is in a wafer state or may be attached after a wafer is individualized to respective memory chips 100.

Figure 9C:
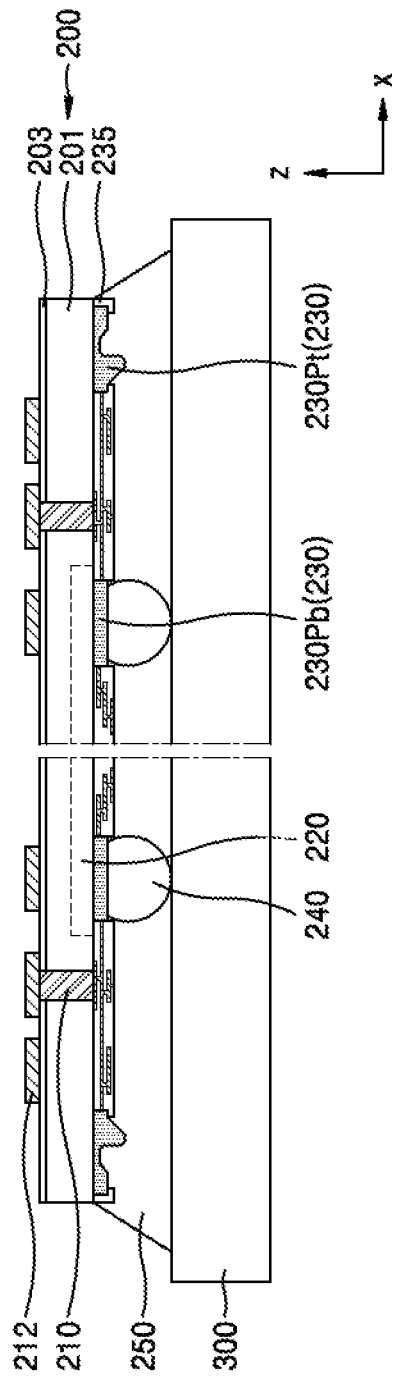

Referring to FIG. 9C, the interface chip 200 is stacked on the PCB 300 through the first bump 240 and the underfill 250. In some embodiments, an adhesive layer like an NCF may be used instead of the underfill 250. Alternatively, the interface chip 200 is stacked on the corresponding PCB 300 of a raw PCB including a plurality of PCBs 300, and, after forming a sealant (see sealant 400 of FIG. 7), in a process for individualizing a package structure into individual semiconductor packages, the raw PCB is separated to individual PCBs 300. However, for convenience of illustration, FIG. 9C shows one PCB 300.

Figure 9D:
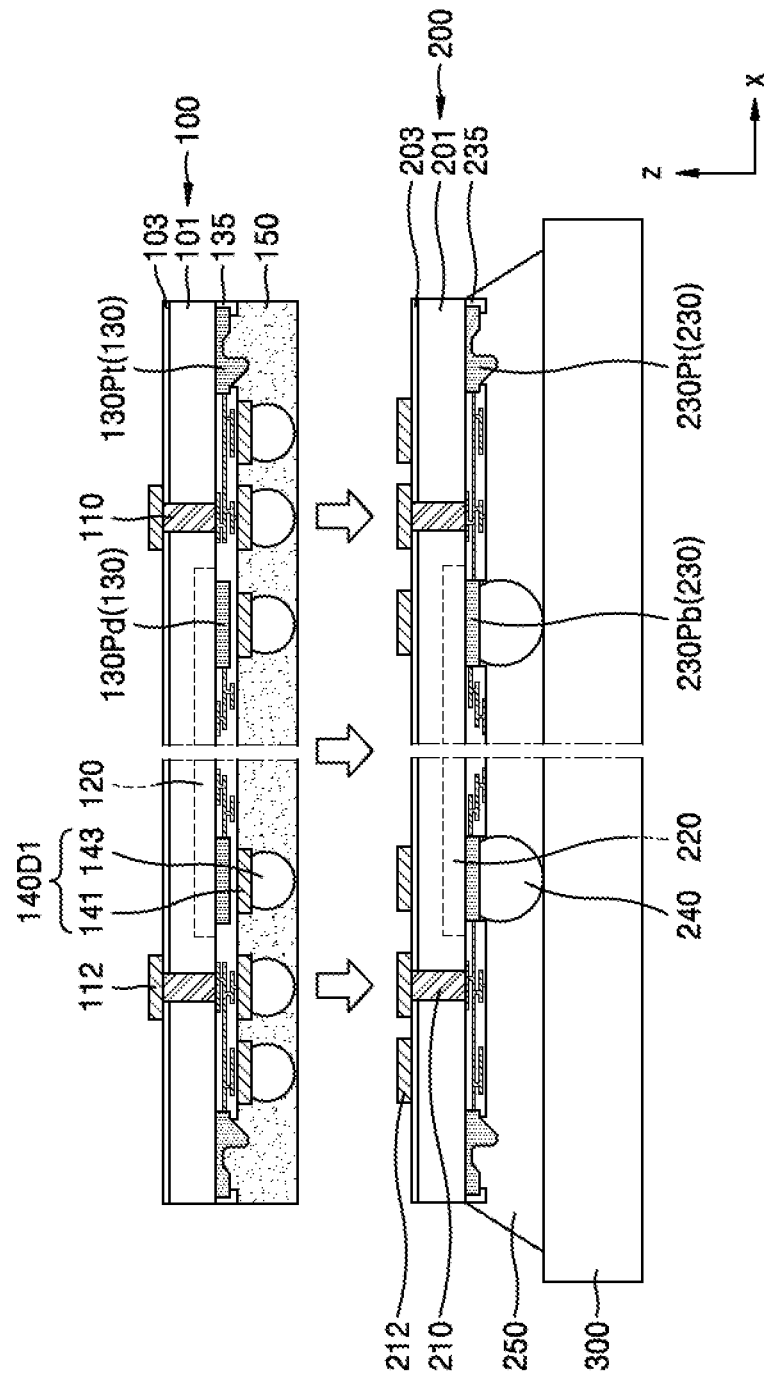

Referring to FIG. 9D, the memory chip 100 is stacked on the interface chip 200 through the adhesive layer 150, the second bump 140, and the dummy bump 140D. For example, the memory chip 100 may be stacked on the interface chip 200 via the adhesive layer 150, which is an NCF, by using the TCB method. As described above in FIGS. 1A and 1B, the presence of dummy bumps 140D provided on the bottom surface of the memory chip 100 minimizes the flowability of the NCF and minimizes solder sweeping, thereby solving problems like a short circuit or a poor contact.

After the memory chip 100 is stacked, a sealant (see 400 of FIG. 7) covering the interface chip 200 and the memory chip 100 is formed. Moreover, in the case of stacking a plurality of memory chips on the interface chip 200 as in the structure of the semiconductor package 1000b of FIG. 8, after each memory chip is stacked on a corresponding interface chip or a memory chip, the sealant 400 may be formed to cover the memory chips.

FIGS. 10A through 10E are cross-sectional views showing an operation for preparing the interface chip of FIG. 9A in more detail. Descriptions of FIGS. 10A to 10E are given below with reference to FIGS. 1A and 1B, and descriptions above with reference to FIGS. 9A to 9D are briefly given or omitted.

Referring to FIG. 10A, one or more device layers 220 are formed in a first wafer 200W. The device layer 220 may be formed at a corresponding portion of the respective interface chips 200. The device layer 220 may include a plurality of logic devices and memory devices. In FIG. 10A, SL denotes a scribe lane that may be removed in a singulation process for subsequently individualizing the first wafer 200W into individual interface chips 200.

Figure 10B:
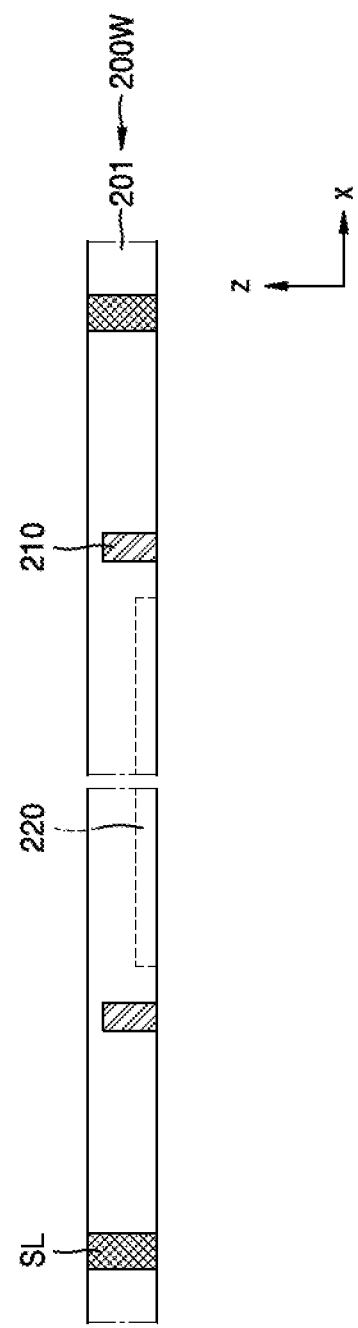

Referring to FIG. 10B, the first TSVs 210 are formed in the first wafer 200W. The first TSVs 210 may be formed to have a pitch equal to or greater than the minimum pitch A0. Moreover, the first TSVs 210 may be formed through a via-middle process. However, a process for forming the first TSVs 210 is not limited to the via-middle process. For reference, a via-first may refer to a process for forming a TSV before forming a device layer, the via-middle may refer to a process for forming a TSV before forming a wire layer after forming a device layer, and a via-last may refer to a process for forming TSV after forming a wire layer.

Figure 10C:
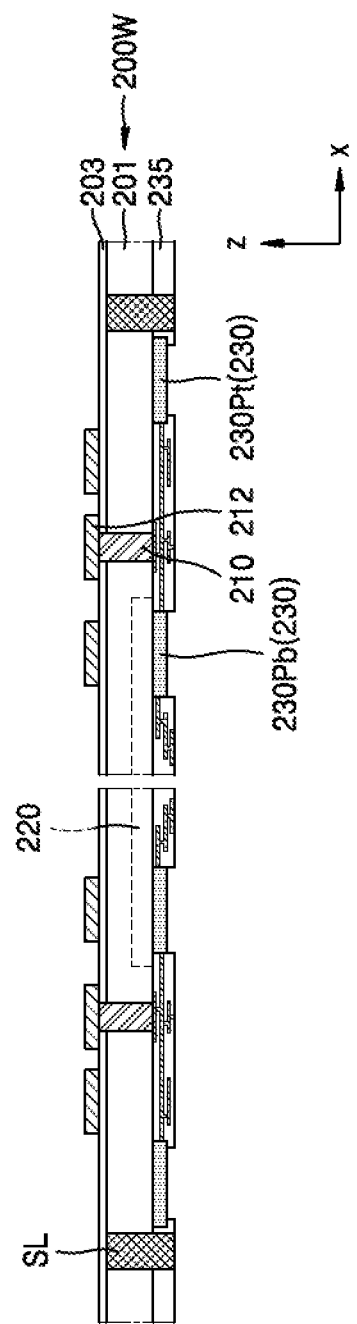

Referring to FIG. 10C, the wire layer 235 is formed on the bottom surface of the first wafer 200W. The process for forming the wire layer 235 may include a process for forming the bump pad 230Pb and the first test pad 230Pt. Moreover, both the bump pad 230Pb and the first test pad 230Pt may be formed in an open structure. Moreover, after the process for forming the wire layer 235, a rear or top surface of the first wafer 200W may be polished and the upper pad 212 may be formed on the top of the first TSV 210.

Figure 10D:
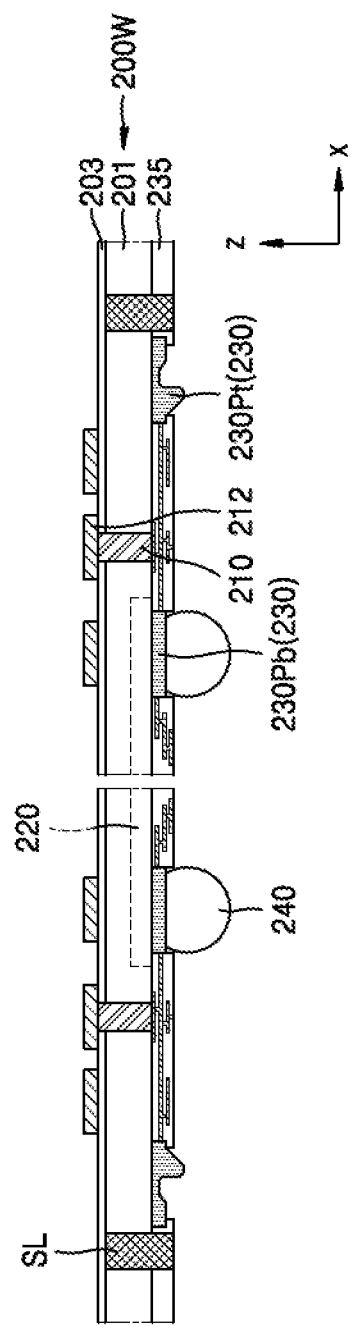

Referring to FIG. 10D, the first bump 240 is attached to the bump pad 230Pb. Moreover, a test on the interface chip 200 may be performed by using the first test pad 230Pt before the first bump 240 is attached.

Figure 10E:
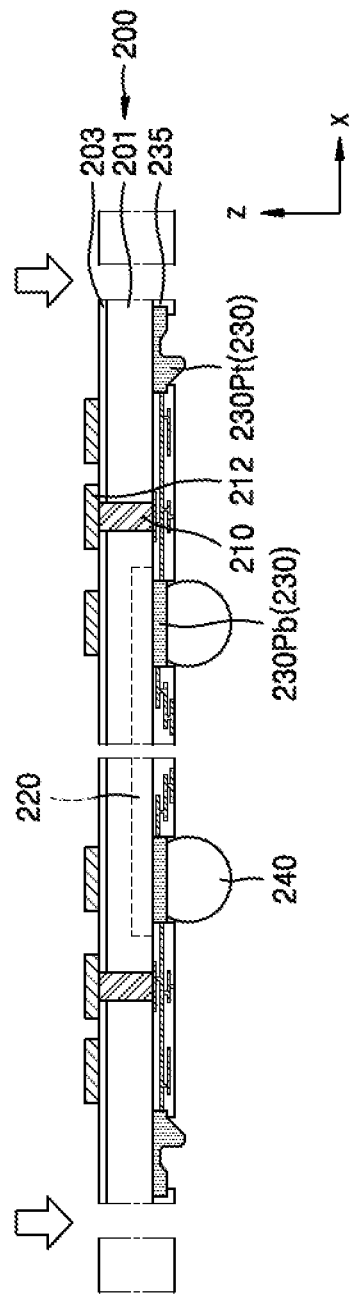

Referring to FIG. 10E, the first wafer 200W is individualized into respective interface chips 200 through a singulation process. Through individualization to the respective interface chips 200, the interface chip 200 of FIG. 9A may be completed and/or prepared.

FIGS. 11A through 11E are cross-sectional views showing an operation for preparing the memory chip of FIG. 9B in more detail. Descriptions of FIGS. 11A to 11E are given below with reference to FIGS. 1A and 1B, and descriptions above with reference to FIGS. 9A to 10E are briefly given or omitted.

Figure 11A:
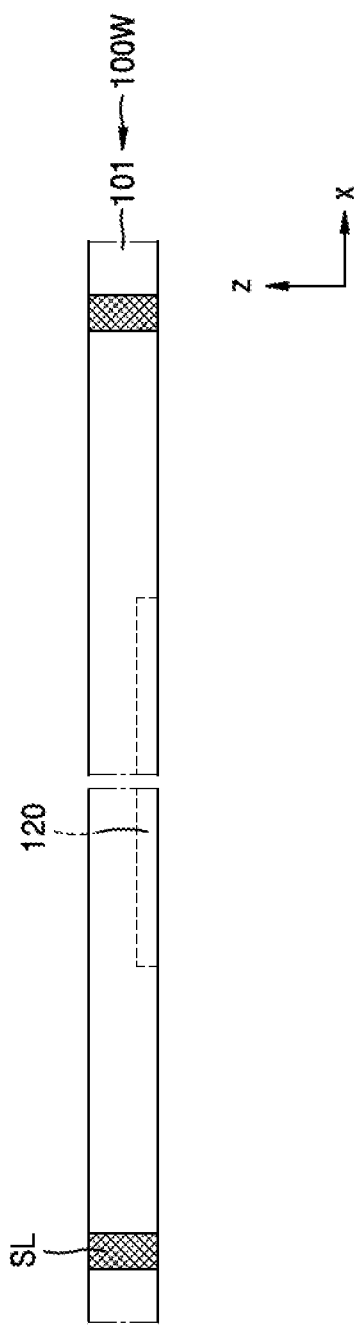
FIGS. 11A through 11E are cross-sectional views showing an operation for preparing the memory chip of FIG. 9B in more detail.

Referring to FIG. 11A, one or more device layers 120 are formed in a second wafer 100W. The device layer 120 may be formed at a corresponding portion of the respective memory chips 100. The device layer 120 may include a plurality of memory devices.

Figure 11B:
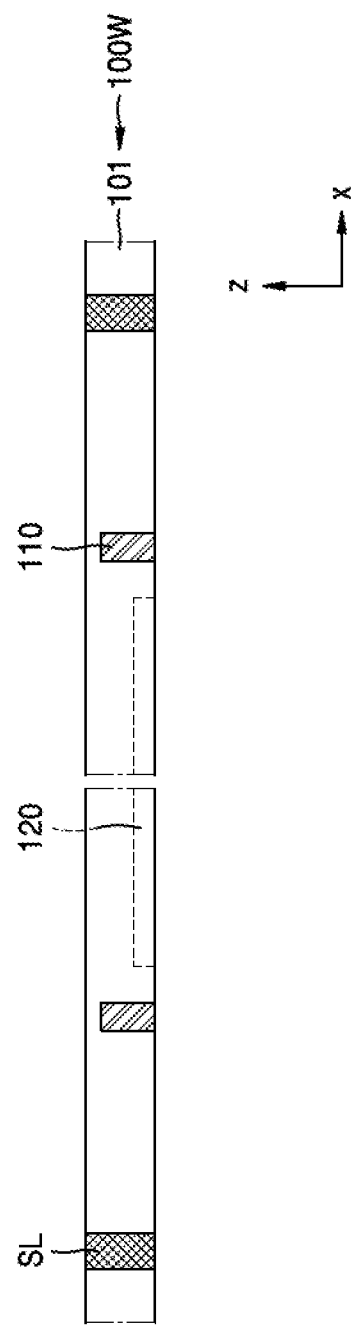

Referring to FIG. 11B, the second TSVs 110 are formed in the second wafer 100W. The second TSVs 110 may be formed to have a pitch equal to or greater than the minimum pitch A0. Moreover, the second TSVs 110 may also be formed through a via-middle process. However, a process for forming the second TSVs 110 is not limited to the via-middle process.

Figure 11C:
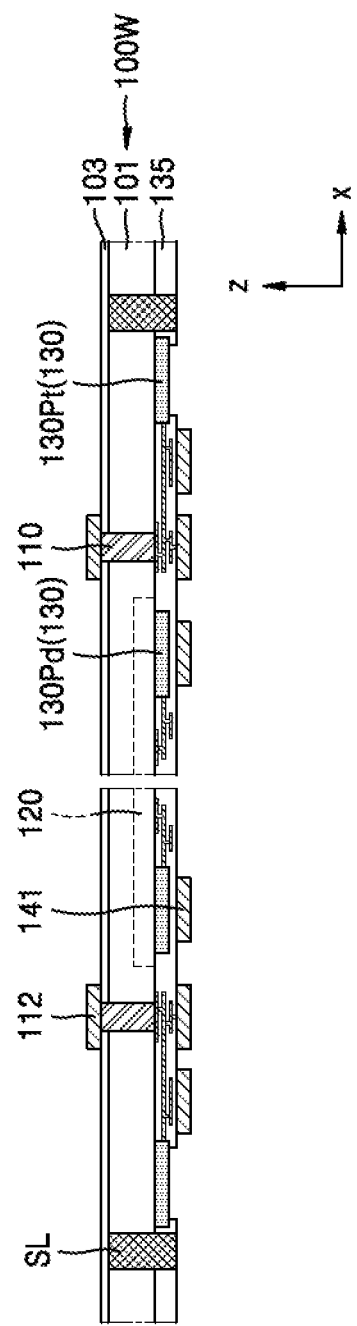

Referring to FIG. 11C, the wire layer 135 is formed on the bottom surface of the second wafer 100W. The process for forming the wire layer 135 may include a process for forming the dummy pad 130Pb and the second test pad 130Pt. Moreover, the dummy pad 130Pd may be formed in a closed structure, and the second test pad 130Pt may be formed in an open structure. Moreover, after the process for forming the wire layer 135, a rear or top surface of the second wafer 100W may be polished and the upper pad 112 may be formed on the top of the second TSV 110.

Figure 11D:
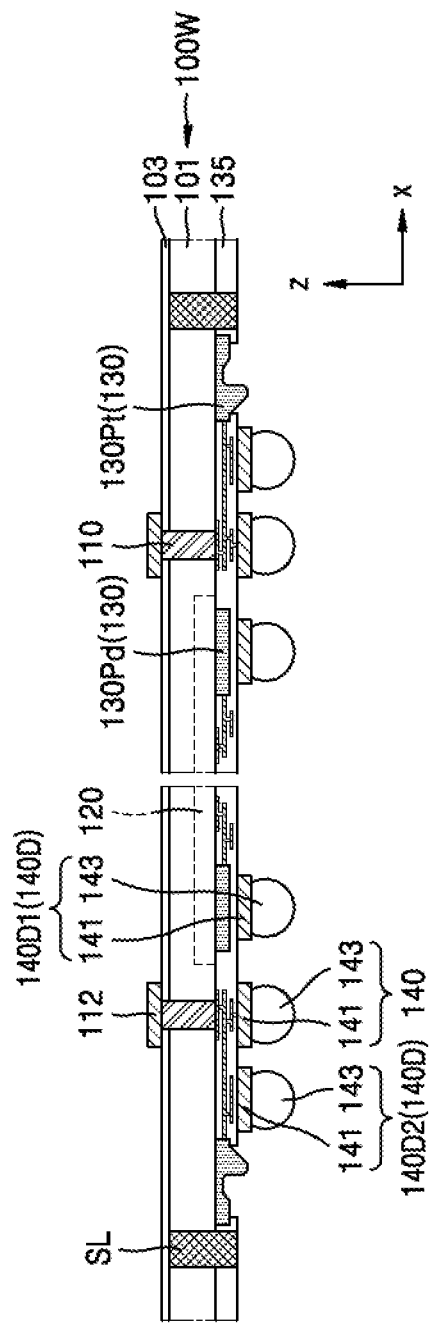

Referring to FIG. 11D, the second bump 140 and the dummy bump 140D are attached to the bottom surface of the memory chip 100. The second bump 140 may be attached to a portion corresponding to the second TSV 110. Moreover, the dummy bump 140D may include the first dummy bump 140D1 and the second dummy bump 140D2, the first dummy bump 140D1 may be attached to a portion corresponding to the dummy pad 130Pd, and the second dummy bump 140D2 may be provided between the second bump 140 and the second test pad 130Pt. The first dummy bump 140D1 and the second dummy bump 140D2 may be arranged to satisfy Inequality (1) and Inequality (2) above. Moreover, a test on the memory chip 100 may be performed by using the second test pad 130Pt before the second bump 140 and the dummy bump 140D are attached.

Figure 11E:
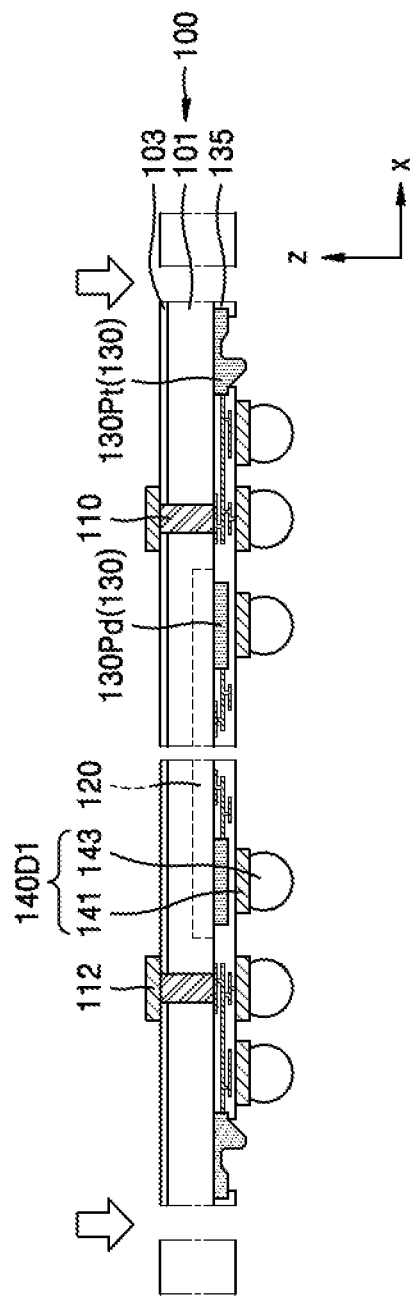

Referring to FIG. 11E, the second wafer 100W is individualized into respective memory chips 100 through a singulation process. Through individualization to the respective memory chips 100, the memory chip 100 of FIG. 9B may be completed and/or prepared. Moreover, the adhesive layer 150 like an NCF may be attached onto the second wafer 100W before individualization to the respective memory chips 100, and then the singulation process may be performed. However, in some embodiments, the adhesive layer 150 may be attached to each of the memory chips 100 after the singulation process.

While the inventive concept has been particularly shown and described with reference to embodiments thereof, it is understood that various changes in form and details may be made therein without departing from the spirit and scope of the following claims.

What is claimed is:

1. A semiconductor package comprising:
   an interface chip comprising a first test pad provided in an outer portion of the interface chip, a bump pad provided inside the first test pad, and a first through silicon via (TSV) provided between the first test pad and the bump pad;
   at least one memory chip stacked on the interface chip, wherein the at least one memory chip comprises a second test pad provided in an outer portion of the at least one memory chip, a dummy pad provided inside the second test pad, and a second TSV provided between the second test pad and the dummy pad; and
   an adhesive layer provided between the interface chip and the at least one memory chip,
   wherein a first bump is provided on the bump pad on a bottom surface of the interface chip,
   a second bump is provided on the second TSV on a bottom surface of the at least one memory chip, a dummy bump is provided on the bottom surface of the at least one memory chip to be adjacent to the second bump, and no bump is provided on the first test pad and the second test pad.

2. The semiconductor package of claim 1, wherein, when a minimum pitch between adjacent second TSVs or adjacent second bumps is denoted as A and a distance between the second bump and the dummy bump is denoted as B, the dummy bump is configured to satisfy A≤B≤2A.

3. The semiconductor package of claim 2, wherein, when a distance between the second test pad and the second bump is greater than 2A, the dummy bump is provided on the at least one memory chip between the second test pad and the second bump, and, when a distance between the second test pad and the dummy bump adjacent thereto is denoted as C, the dummy bump is configured to satisfy A≤C.

4. The semiconductor package of claim 3, wherein the adhesive layer includes a non-conductive film (NCF) and has a structure protruding outward from side surfaces of the interface chip and the at least one memory chip, and the dummy bump is configured to minimize flowability of the NCF when the at least one memory chip and the interface chip are bonded to each other by using a temperature-compression bonding (TCB) method.

5. The semiconductor package of claim 2, wherein a first dummy bump, the second bump, a second dummy bump, and the second test pad are arranged in an order stated in a first direction from a center of the at least one memory chip toward an outside, first dummy bumps, second bumps, second dummy bumps, and second test pads are each arranged in a second direction perpendicular to the first direction, and, when a pitch between the second bumps adjacent to each other in the second direction is greater than 2A, a third dummy bump is provided between the second bumps, and third dummy bumps are arranged in the second direction between the first dummy bumps and between the second dummy bumps.

6. The semiconductor package of claim 2, wherein the second bump and the dummy bump have substantially the same size, and when a diameter of the second bump in a horizontal direction is denoted as D, the second bump satisfies 1.5D≤A.

7. The semiconductor device of claim 6, wherein, when a height of the second bump is denoted as E, an inequality 0.5D≤E≤1.5D is satisfied.

8. The semiconductor package of claim 1, wherein the bump pad is formed in an open structure and is electrically connected to the first bump, and the dummy pad is formed in a closed structure and is not electrically connected to the dummy bump provided on the dummy pad.

9. The semiconductor package of claim 1, wherein the interface chip and the at least one memory chip have substantially the same size, the first test pad and the second test pad overlap each other, the bump pad and the dummy pad overlap each other, and the first TSV and the second TSV are arranged in positions overlapping each other, and the first TSV and the second TSV are electrically connected to each other through the second bump.

10. The semiconductor package of claim 1, wherein the at least one memory chip includes a plurality of memory chips, the memory chips of the at least one memory chip except for a lowermost memory chip are stacked on other memory chips corresponding thereto, and the at least one memory chip is stacked on the interface chip or a corresponding memory chip via an adhesive layer by using a temperature-compression bonding (TCB) method.

11. A semiconductor package comprising:

an interface chip comprising a first test pad provided in an outer portion, a bump pad provided inside the first test pad, and a first through silicon via (TSV) provided between the first test pad and the bump pad;

at least one memory chip, which is stacked on the interface chip and comprises a second test pad provided in an outer portion, a dummy pad provided inside the second test pad, and a second TSV provided between the second test pad and the dummy pad; and an adhesive layer provided between the interface chip and the at least one memory chip.

wherein the interface chip and the at least one memory chip have substantially the same size, the first test pad and the second test pad overlap each other, and the bump pad and the dummy pad overlap each other, and the bump pad is formed in an open structure, and the dummy pad is formed in a closed structure.

12. The semiconductor package of claim 11, wherein a first bump is provided on the bump pad on a bottom surface of the interface chip and is electrically connected to the bump pad, and a dummy bump is provided on the dummy pad on a bottom surface of the at least one memory chip and the dummy bump is not electrically connected to the dummy pad.

13. The semiconductor package of claim 11, wherein the first TSV and the second TSV overlap each other, a second bump is provided on the second TSV on a bottom surface of the at least one memory chip to electrically connect the first TSV to the second TSV through the second bump, and a dummy bump is provided on a bottom surface of the at least one memory chip to be adjacent to the second bump.

14. The semiconductor package of claim 11, wherein no bump is provided on the first test pad and the second test pad, and a second bump is provided on the second TSV on a bottom surface of the at least one memory chip, a first dummy bump is provided on the dummy pad, and a second dummy bump is provided between the second bump and the second test pad.

15. The semiconductor package of claim 11, wherein the adhesive layer includes a non-conductive film (NCF) and has a structure protruding outward from side surfaces of the interface chip and the at least one memory chip, and a dummy bump is provided to reduce flowability of the NCF when the at least one memory chip and the interface chip are bonded to each other by using a temperature-compression bonding (TCB) method.

16. A semiconductor package comprising:

a printed circuit substrate (PCB);

an interface chip, which is stacked on the PCB and comprises a first test pad provided in an outer portion, a bump pad provided inside the first test pad, and a first through silicon via (TSV) provided between the first test pad and the bump pad;

at least one memory chip, which is stacked on the interface chip and comprises a second test pad provided in an outer portion, a dummy pad provided inside the second test pad, and a second TSV provided between the second test pad and the dummy pad;

an adhesive layer provided between the interface chip and the at least one memory chip; and a sealant for sealing the interface chip and the at least one memory chip on the PCB, wherein the interface chip and the at least one memory chip have substantially the same size, the bump pad and the dummy pad overlap each other and the first test pad and the second test pad overlap each other, a first bump is provided on the bump pad on a bottom surface of the interface chip, and a second bump is provided on the second TSV on a bottom surface of the at least one memory chip and a first dummy bump is provided on the dummy pad on a bottom surface of the at least one memory chip.

17. The semiconductor package of claim 16, wherein no bump is provided on the first test pad and the second test pad, the bump pad has an open structure and is electrically connected to the first bump, and the dummy pad has a closed structure and is not electrically connected to the first dummy bump.

18. The semiconductor package of claim 16, wherein a second dummy bump is provided on the bottom surface of the at least one memory chip between the second test pad and the second bump, and, when a minimum pitch between adjacent second TSVs or adjacent second bumps is denoted as A, a distance between the second bump and the first dummy bump or a second dummy bump is denoted as B, and a distance between the second test pad and the second dummy bump is denoted as C, inequalities $A \leq B \leq 2A$ and $A \leq C$ are satisfied.

19. The semiconductor package of claim 18, wherein the adhesive layer includes a non-conductive film (NCF) and has a structure protruding outward from side surfaces of the interface chip and the at least one memory chip, and a dummy bump is configured to minimize flowability of the NCF when the at least one memory chip and the interface chip are bonded to each other by using a temperature-compression bonding (TCB) method.

20. The semiconductor package of claim 18, wherein the first dummy bump, the second bump, the second dummy bump, and a test pad are arranged in an order stated in a first direction from a center of the at least one memory chip toward the outside, first dummy bumps, second bumps, second dummy bumps, and test pads are each arranged in a second direction perpendicular to the first direction, and, when a pitch between the second bumps adjacent to each other in the second direction is greater than 2A, a third dummy bump is provided between the second bumps, and third dummy bumps are also arranged in the second direction between the first dummy bumps and between the second dummy bumps.

* * * * *